US010764986B2

(12) United States Patent
Nagai et al.

(10) Patent No.: US 10,764,986 B2
(45) Date of Patent: *Sep. 1, 2020

(54) EXTREME ULTRAVIOLET LIGHT GENERATION APPARATUS

(71) Applicant: GIGAPHOTON INC., Tochigi (JP)

(72) Inventors: Shinji Nagai, Hiratsuka (JP); Tamotsu Abe, Hiratsuka (JP); Hitoshi Nagano, Hiratsuka (JP); Osamu Wakabayashi, Hiratsuka (JP)

(73) Assignee: Gigaphoton Inc., Tochigi (JP)

( * ) Notice: Subject to any disclaimer, the term of this patent is extended or adjusted under 35 U.S.C. 154(b) by 711 days.

This patent is subject to a terminal disclaimer.

(21) Appl. No.: 15/347,716

(22) Filed: Nov. 9, 2016

(65) Prior Publication Data
US 2017/0055336 A1    Feb. 23, 2017

Related U.S. Application Data

(63) Continuation of application No. 14/481,620, filed on Sep. 9, 2014, now Pat. No. 9,510,433, which is a (Continued)

(30) Foreign Application Priority Data

Mar. 18, 2010   (JP) .................................. 2010-063358
Jan. 28, 2011   (JP) .................................. 2011-017252
(Continued)

(51) Int. Cl.
*H05G 2/00*       (2006.01)
*G03F 7/20*       (2006.01)
(Continued)

(52) U.S. Cl.
CPC ............. *H05G 2/008* (2013.01); *B23K 10/00* (2013.01); *B23K 26/12* (2013.01); *B23K 26/36* (2013.01);
(Continued)

(58) Field of Classification Search
CPC ........ H05G 2/008; H05G 2/005; G21K 1/067; G03F 7/70; B23K 26/352
(Continued)

(56) References Cited

U.S. PATENT DOCUMENTS 6,882,704 B2    4/2005   Schriever et al.
7,164,144 B2 *  1/2007   Partlo .................... B82Y 10/00
                                                    250/493.1
(Continued)

FOREIGN PATENT DOCUMENTS

JP    2005-217398 A    8/2005
JP    2006-529057 A    12/2006
(Continued)

OTHER PUBLICATIONS

Notice of Allowance issued in U.S. Appl. No. 13/474,100 dated Jun. 10, 2014.
(Continued)

*Primary Examiner* — Thien S Tran
(74) *Attorney, Agent, or Firm* — Studebaker & Brackett PC

(57) ABSTRACT

An apparatus for generating extreme ultraviolet light used with a laser apparatus and connected to an external device so as to supply the extreme ultraviolet light thereto includes a chamber provided with at least one inlet through which a laser beam is introduced into the chamber; a target supply unit provided on the chamber configured to supply a target material to a predetermined region inside the chamber; a discharge pump connected to the chamber; at least one optical element provided inside the chamber; an etching gas introduction, unit provided on the chamber through which an etching gas passes; and at least one temperature control mechanism for controlling a temperature of the at least one optical element.

20 Claims, 27 Drawing Sheets

Related U.S. Application Data continuation of application No. 13/474,100, filed on May 17, 2012, now Pat. No. 8,872,142, which is a continuation-in-part of application No. 13/048,454, filed on Mar. 15, 2011, now Pat. No. 8,624,208.

(30) Foreign Application Priority Data

| Mar. 7, 2011 | (JP) | 2011-049687 |
|---|---|---|
| Jun. 17, 2011 | (JP) | 2011-135566 |

(51) Int. Cl.

| G21K 1/06 | (2006.01) |
|---|---|
| B23K 26/352 | (2014.01) |
| G21K 5/02 | (2006.01) |
| G21K 5/00 | (2006.01) |
| B23K 10/00 | (2006.01) |
| G03B 27/32 | (2006.01) |
| B23K 26/36 | (2014.01) |
| B23K 26/12 | (2014.01) |

(52) U.S. Cl.
CPC ......... *G03B 27/32* (2013.01); *G03F 7/70025* (2013.01); *G03F 7/70033* (2013.01); *G21K 1/067* (2013.01); *G21K 5/00* (2013.01); *G21K 5/02* (2013.01); *H05G 2/005* (2013.01); *G21K 2201/064* (2013.01)

(58) Field of Classification Search
USPC ................... 219/121.6, 121.84; 250/504 R
See application file for complete search history.

(56) References Cited

U.S. PATENT DOCUMENTS

| 7,250,616 | B2 | 7/2007 | Honda et al. | |
|---|---|---|---|---|
| 7,271,401 | B2* | 9/2007 | Imai | B82Y 10/00 250/423 R |
| 7,465,946 | B2 | 12/2008 | Bowering et al. | |
| 7,473,908 | B2 | 1/2009 | Van Herpen et al. | |
| 7,598,509 | B2 | 10/2009 | Ershov et al. | |
| 7,615,766 | B2 | 11/2009 | Nakano | |
| 7,641,349 | B1* | 1/2010 | Chrobak | G02B 5/0891 359/845 |
| 7,655,925 | B2 | 2/2010 | Bykanov et al. | |
| 7,916,388 | B2 | 3/2011 | Bykanov | |
| 8,138,487 | B2* | 3/2012 | Vaschenko | H05G 2/003 250/504 R |
| 8,158,959 | B2* | 4/2012 | Asayama | H05G 2/003 250/365 |
| 8,654,438 | B2 | 2/2014 | Hou et al. | |
| 8,872,142 | B2* | 10/2014 | Nagai | G03F 7/70025 250/504 R |
| 2007/0115444 | A1 | 5/2007 | Miyazaki | |
| 2009/0057567 | A1* | 3/2009 | Bykanov | G03F 7/70033 250/429 |
| 2010/0181503 | A1* | 7/2010 | Yanagida | G03F 7/70033 250/504 R |
| 2010/0217444 | A1 | 8/2010 | Watanabe et al. | |
| 2011/0048452 | A1 | 3/2011 | Zink et al. | |
| 2011/0226745 | A1 | 9/2011 | Nagai et al. | |
| 2012/0182536 | A1 | 7/2012 | Loopstra et al. | |

FOREIGN PATENT DOCUMENTS

| JP | 2007-035660 A | 2/2007 |
|---|---|---|
| JP | 2007-266234 A | 10/2007 |
| JP | 2010-538420 A | 12/2010 |
| JP | 2012-169580 A | 9/2012 |
| WO | 2006/093783 A2 | 9/2006 |
| WO | 2007/005414 A2 | 1/2007 |
| WO | 2008/007952 A2 | 1/2008 |
| WO | 2009/032054 A1 | 3/2009 |
| WO | 2011/036248 A1 | 3/2011 |

OTHER PUBLICATIONS

Non-Final Office Action issued in U.S. Appl. No. 13/048,454 dated Mar. 14, 2013.
Notice of Allowance issued in U.S. Appl. No. 13/048,454 dated Sep. 10, 2013.
Notice of Rejection, Japanese Patent Application No. 2011-049687 dated Oct. 7, 2014 with full English translation.
Notice of Rejection, Japanese Patent Application No. 2011-135566 dated Jan. 27, 2015 with full English translation.
Decision of a Patent Grant, Japanese Patent Application No. 2011-049687 dated Jan. 27, 2015 with full English translation.

* cited by examiner

EXTREME ULTRAVIOLET LIGHT GENERATION APPARATUS

CROSS-REFERENCE TO RELATED APPLICATIONS

The present application is a Continuation of U.S. application Ser. No. 14/481,620 filed Sep. 9, 2014, which is a Continuation application of U.S. Ser. No. 13/474,100 filed May 17, 2012, now U.S. Pat. No. 8,872,142, which is a Continuation-in-Part application of U.S. Ser. No. 13/048,454 filed Mar. 15, 2011, now U.S. Pat. No. 8,624,208, which claims priority from Japanese Patent Application No. 2010-063358 filed Mar. 18, 2010, Japanese Patent Application No. 2011-017252 filed Jan. 28, 2011, and Japanese Patent Application No. 2011-049687 filed Mar. 7, 2011. This application further claims priority from Japanese Patent Application No. 2011-135566 filed Jun. 17, 2011.

BACKGROUND

1. Technical Field

This disclosure relates to an extreme ultraviolet (EUV) light generation apparatus.

2. Related Art

In recent years, semiconductor production processes have become capable of producing semiconductor devices with increasingly fine feature sizes, as photolithography has been making rapid progress toward finer fabrication. In the next generation of semiconductor production processes, microfabrication with feature sizes at 60 nm to 45 nm, and further, microfabrication with feature sizes of 32 nm or less will be required. In order to meet the demand for microfabrication with feature sizes of 32 nm or less, for example, an exposure apparatus in which a system for generating EUV light at a wavelength of approximately 13 nm combined with a reduced projection reflective optical system is needed.

Three kinds of systems for generating EUV light are known in general, which include a Laser Produced Plasma (LPP) type system in which plasma is generated by irradiating a target material with a laser beam, a Discharge Produced Plasma (DPP) type system in which plasma is generated by electric discharge, and a Synchrotron Radiation (SR) type system in which orbital radiation is used.

SUMMARY

An apparatus according to one aspect of this disclosure for generating extreme ultraviolet light, which may be used with a laser apparatus and connected to an external device so as to supply the extreme ultraviolet light thereto, may include: a chamber provided with at least one inlet through which a laser beam is introduced into the chamber; a target supply unit provided on the chamber configured to supply a target material to a predetermined region inside the chamber; a discharge pump connected to the chamber; at least one optical element provided inside the chamber; an etching gas introduction unit provided on the chamber through which an etching gas passes; and at least one temperature control mechanism for controlling a temperature of the at least one optical element.

An apparatus according to another aspect of this disclosure for generating extreme ultraviolet light, which may be used with a laser apparatus and connected to an external device so as to supply the extreme ultraviolet light thereto, may include: a chamber provided with at least one inlet through which a laser beam is introduced into the chamber; a target supply unit provided on the chamber configured to supply a target material to a predetermined region inside the chamber; a discharge pump connected to the chamber; a collector mirror for collecting the extreme ultraviolet light emitted from plasma of the target material; and a gas supply unit is provided with a gas outlet and is positioned so that the gas outlet is oriented toward a reflective surface of the collector mirror.

BRIEF DESCRIPTION OF THE DRAWINGS

Hereinafter, selected embodiments of this disclosure will be described with reference to the accompanying drawings.

DETAILED DESCRIPTION

Figure 1:
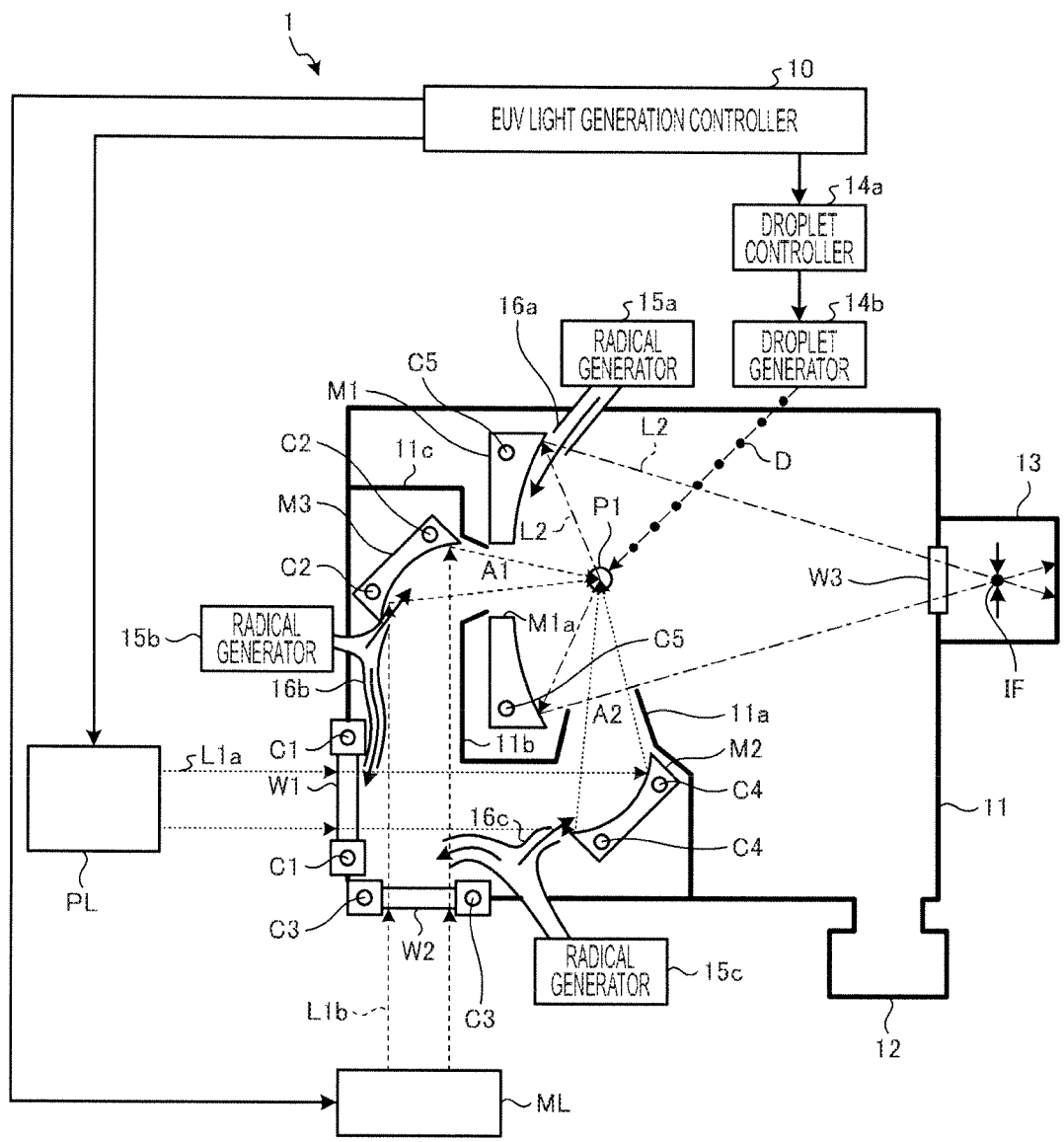
FIG. 1 schematically illustrates the configuration of an EUV light generation system according to a first embodiment of this disclosure.

Hereinafter, selected embodiments for implementing this disclosure will be described in detail with reference to the accompanying drawings. In the subsequent description, each drawing merely illustrates shape, size, and positional relationship schematically to the extent that enables the content of this disclosure to be understood. Thus, this disclosure is not limited to the shape, the size, and the positional relationship illustrated in each drawing. In order to show the configuration clearly, part of the hatching along a section may be omitted in the drawings. Further, numerical values indicated herein are merely examples of this disclosure; thus, this disclosure is not limited to the indicated numerical values.

First Embodiment

An EUV light generation system according to a first embodiment of this disclosure will be described in detail with reference to the drawings. FIG. 1 schematically illustrates the configuration of an EUV light generation system 1 according to the first embodiment.

As shown in FIG. 1, the EUV light generation system 1 may include an airtight chamber 11, an exposure apparatus connection part 13, a droplet generator 14b provided with a droplet controller 14a, a pre-pulse laser PL, a main pulse laser ML, and an EUV light generation controller 10. The chamber 11 may define a space where EUV light is generated. The exposure apparatus connection part 13 may optically connect the chamber 11 to an exposure apparatus (not shown). The droplet generator 14b may be configured to supply a target material, such as tin (Sn), into the chamber 11 in the form of droplets D through a nozzle (not shown). The pre-pulse laser PL may be configured to output a pre-pulse laser beam L1a. The main pulse laser ML may be configured to output a main pulse laser beam L1b. The EUV light generation controller 10 may be configured to control the pre-pulse laser PL, the main pulse laser ML, the droplet controller 14a, and so forth.

The chamber 11 may be provided with windows W1 and W2. The pre-pulse laser beam L1a and the main pulse laser beam L1b may pass through the respective windows W1 and W2 and enter the chamber 11, respectively. Off-axis paraboloidal mirrors M2 and M3 for respectively focusing the pre-pulse laser beam L1a and the main pulse laser beam L1b in a plasma generation region P1 defined inside the chamber 11 may be provided in the chamber 11. Further, an EUV collector mirror M1 may be provided in the chamber 11, and the EUV collector mirror M1 may be positioned to reflect EUV light L2 generated in the plasma generation region P1 such that the EUV light L2 is focused in an intermediate focus region IF set inside the exposure apparatus connection part 13.

With the above configuration, the EUV light generation controller 10 may control the droplet controller 14a to thereby control a timing at which the droplet D is outputted from the droplet generator 14b. The droplet D outputted from the droplet generator 14b may arrive in the plasma generation region P1. Further, the EUV light generation controller 10 may control a timing at which the pre-pulse laser beam L1a is outputted from the pre-pulse laser PL and a timing at which the main pulse laser beam L1b is outputted from the main pulse laser ML. At a timing at which the droplet D arrives in the plasma generation region P1, the pre-pulse laser beam L1a may be focused on the droplet D by the off-axis paraboloidal mirror M2 (first-stage laser irradiation). With this, the droplet D may be diffused and turned into a state in which weak plasma, neutral particles, clusters, fragments, and the like mixedly exist. In the description to follow, a target material in this state maybe referred to as a diffused target.

The main pulse laser beam L1b from the main pulse laser ML may be focused on the diffused target in the plasma generation region P1 by the off-axis paraboloidal mirror M3 (second-stage laser irradiation) through a through-hole M1a formed in the EUV collector mirror M1. With this, the diffused target may be turned into plasma. The EUV light L2 may be emitted when this plasma is deexcited.

The EUV light L2 emitted from the plasma may be reflected by the spheroidal EUV collector mirror M1 toward the exposure apparatus connection part 13. The reflected EUV light L2 may once be focused in the intermediate focus region IF, and then be outputted to the exposure apparatus through a waveguide, such as a tube (not shown).

In the first embodiment, the target material in the form of a droplet D, may be turned into plasma with two-stage laser beam irradiation. However, this disclosure is not limited thereto, and the target material may be turned into plasma with one-stage, or three-or-more-stage laser beam irradiation. Further, in the first embodiment, the target material may be supplied in the form of droplets. However, this disclosure is not limited thereto, and a solid target material that is rotatably set inside the chamber 11 may also be used.

After the EUV light L2 is emitted, particles of the target material, Sn in this embodiment, such as ions, atoms, charged particles, and neutral particles, hereinafter, collectively referred to as Sn debris, may be emitted from the plasma generated in the plasma generation region P1. This Sn debris may adhere onto the optical elements, such as the EUV collector mirror M1 and the off-axis paraboloidal mirrors M2 and M3, provided inside the chamber 11, and may be deposited thereon.

Therefore, the EUV light generation system 1 of the first embodiment may include radical generators 15a through 15c each configured to supply hydrogen radicals, hereinafter, referred to as H radicals or H*, into the chamber 11, and a discharge pump 12 for discharging a gas from the chamber 11. H radicals from the radical generators 15a through 15c may be supplied into the chamber 11 through respective gas introduction pipes 16a through 16c extending into the chamber 11. The radical generators 15a through 15c and the gas introduction pipes 16a through 16c may be positioned to allow an etching gas, such as H radicals or $H_2$ gas, to flow along the surface of the optical elements provided inside the chamber 11. With this, the etching gas may etch the Sn debris deposited on the optical elements.

Gas discharge ports of the respective gas introduction pipes 16a through 16c may point toward the reflective surfaces of the EUV collector mirror M1 and the off-axis paraboloidal mirrors M3 and M2, respectively. With this, the H radicals flowing along the reflective surfaces of the optical elements may react with the Sn debris deposited on the optical elements, and stannane ($SnH_4$) gas may be produced. This stannane gas is in a gaseous state approximately at or above −52° C. In this way, by allowing Sn and the H radicals to react with each other, the Sn debris deposited on the optical elements may be etched. The stannane gas produced through the etching reaction may be discharged outside the chamber 11 through the discharge pump 12. As a result, performance degradation of the optical elements can be reduced. Note that, in the first embodiment and the other embodiments to be described later, the gas discharge port may be realized by an opening, a slit, or any other suitable form.

In the first embodiment, hydrogen may be supplied in the form of radicals in order to etch the Sn debris deposited on the optical elements with high efficiency. However, this disclosure is not limited thereto, and hydrogen may be supplied in the form of hydrogen molecules ($H_2$). In this case, the hydrogen molecules may be transformed into the H radicals by ultraviolet light, vacuum ultraviolet light, EUV light, and the like emitted in the plasma generation region P1, and the H radicals produced may react with the Sn debris. As a result, the Sn debris deposited on the optical elements may be etched, and performance degradation of the optical elements may be suppressed. In this example, the radical generators 15a through 15c may not be required, and in place of the radical generators 15a through 15c, a hydrogen gas supply source may be provided.

Partitions 11a through 11c may be provided inside the chamber 11. Each of the partitions 11a through 11c may, for example, be plate-shaped. The flow of a gas, such as H radicals, hydrogen gas, and stannane gas, inside the chamber 11 may be controlled with the partitions 11a through 11c. As a result, the Sn debris on the optical elements may be etched efficiently, and the stannane gas may be discharged from the chamber 11 efficiently as well. An opening A1 defined between the partitions 11b and 11c may serve as a part of a flow channel of the etching gas and as a part of a beam path of the main pulse laser beam L1b. An opening A2 defined between the partitions 11a and 11b may serve as a part of a flow channel of the etching gas and as a part of a beam path of the pre-pulse laser beam L1a.

Furthermore, the flow of the gas may be controlled with the partitions 11a through 11c such that the gas flows from the optical elements toward the plasma generation region P1, whereby the Sn debris may be prevented from adhering onto the optical elements. With this, performance degradation of the optical elements may be suppressed more reliably.

Figure 2:
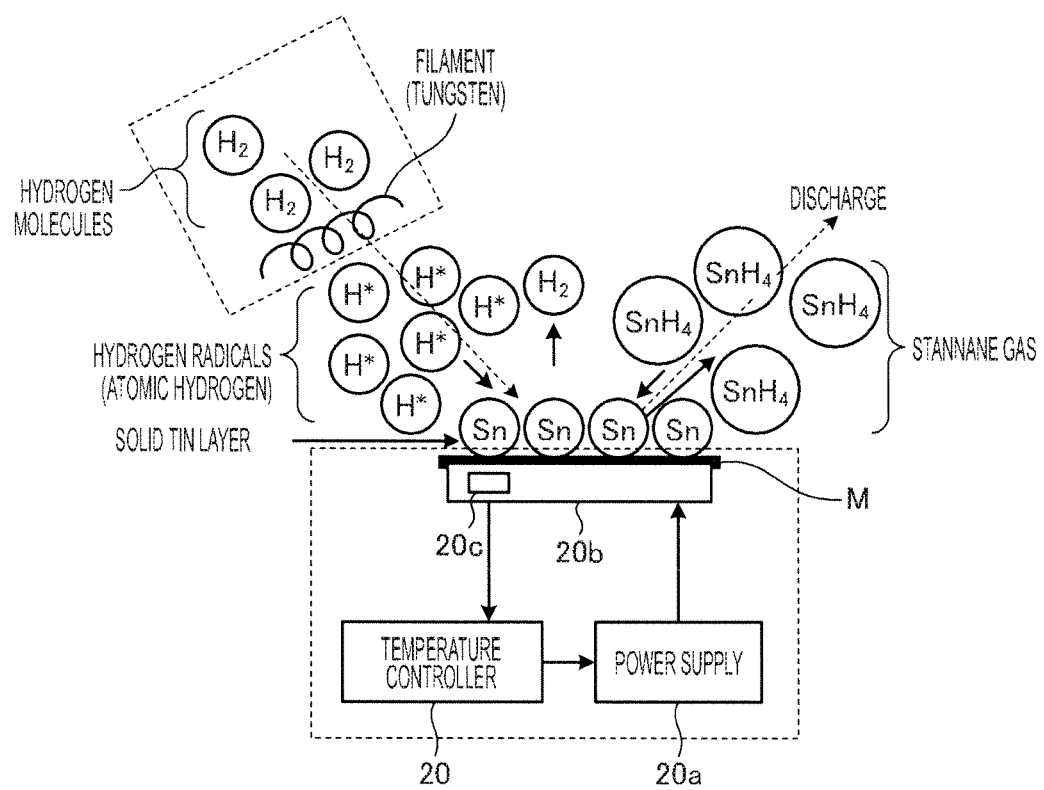
FIG. 2 schematically illustrates a reaction in which hydrogen molecules are transformed into hydrogen radicals and the hydrogen radicals react with solid tin (Sn) deposited on an optical element to thereby be turned into stannane gas, and a reaction in which the stannane gas is decomposed and solid Sn is deposited.

FIG. 2 schematically illustrates a reaction in which hydrogen molecules are transformed into the hydrogen radicals and the hydrogen radicals react with solid Sn deposited on an optical element to thereby be turned into stannane gas, and a reaction in which the stannane gas is decomposed and solid Sn is deposited. The reaction of Sn and the H radicals may be expressed by the following chemical reaction formulae (1) and (2):

etching reaction:

$$Sn(s)+4H^*(g) \rightarrow SnH_4(g) \quad (1)$$

deposition reaction:

$$SnH_4 \rightarrow Sn(s)+2H_2 \quad (2)$$

Here, (s) and (g) indicate a solid state and a gaseous state, respectively. The reactions given by the chemical reaction formulae (1) and (2) may occur simultaneously. A total etching rate Val may be expressed as a difference between an etching reaction rate Ve and a deposition reaction rate Vd, as given by the following expression (3):

$$Val=Ve-Vd \quad (3)$$

The etching reaction rate Ve, the deposition reaction rate Vd, and the total etching rate Val may vary depending on the temperature of a given optical element when the concentrations of H radicals, $H_2$, and $SnH_4$ are constant.

FIG. 2 also illustrates the configuration of a temperature control mechanism for controlling the temperature of an optical element. The temperature control mechanism may include a temperature control element 20b, a power supply 20a, a temperature sensor 20c, and a temperature controller 20. The temperature control element 20b may be provided on an optical element M, such as the EUV collector mirror M1. The power supply 20a may supply electric current to the temperature control element 20b. The temperature sensor 20c may be provided on the optical element M. The temperature controller 20 may be configured to control the electric current to be supplied to the temperature control element 20b from the power supply 20a based on the temperature detected by the temperature sensor 20c. An example of the temperature control element 20b may include a heater, and the electric current supplied to the heater may be controlled based on the detection result of the temperature sensor 20c. By use of the temperature sensor 20c, the temperature may be retained at a predetermined temperature.

Figure 3:
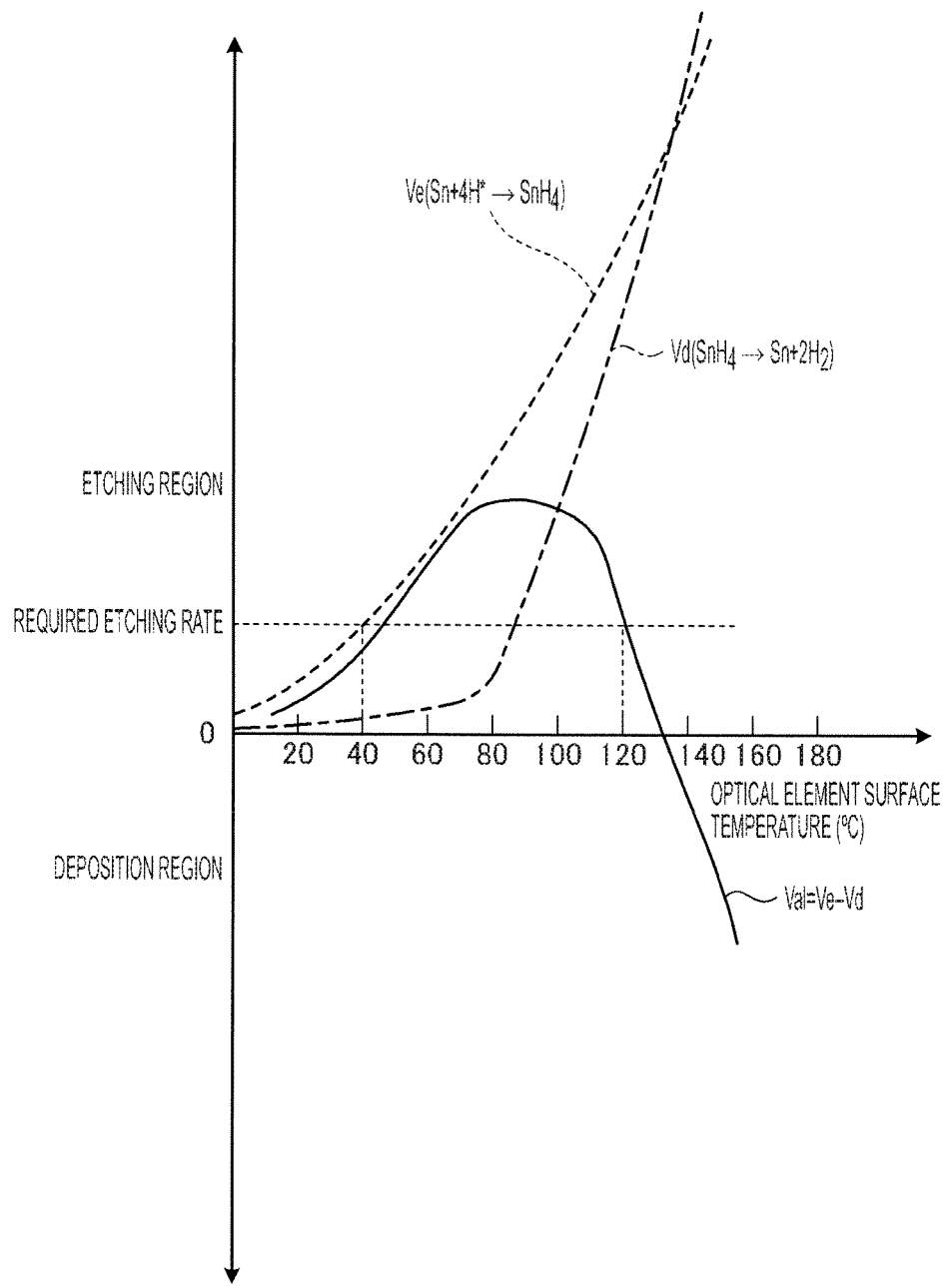
FIG. 3 is a graph showing the relationship between the temperature and each of an etching reaction rate of Sn, a deposition reaction rate of Sn, and a total etching rate represented by a difference between the etching reaction rate of Sn and the deposition reaction rate of Sn.

The total etching rate Val with respect to a set temperature range, which in this example is from the normal temperature to the temperature at which heating control is possible, has been measured. FIG. 3 is a graph showing the relationship between the temperature and each of the etching reaction rate of Sn, the deposition reaction rate of Sn, and the total etching rate. In FIG. 3, a dashed line indicates the temperature dependency of the etching reaction rate Ve, and a dot-dashed line indicates the temperature dependency of the deposition reaction rate Vd. A solid line indicates the total etching rate Val=Ve−Vd. The total etching rate Val being 0 indicates that the etching reaction rate Ve is equal to the deposition reaction rate Vd. When the etching reaction rate Ve is equal to the deposition reaction rate Vd, Sn on the optical element may not be removed. The total etching rate Val being in a positive range indicates that Sn on the optical element may be etched. Conversely, the total etching rate Val being in a negative range indicates that Sn may further be deposited on the optical element. Therefore, the electric current to be supplied to the temperature control element 20b from the power supply 20a may be controlled such that the temperature of the optical element M is retained within a target temperature range. For example, the temperature of the optical element M may be retained in a range of 40° C. to 120° C. inclusive, or in a range of 60° C. to 100° C. inclusive. When the temperature of the optical element M is retained in these ranges, the total etching rate Val may be retained above a target etching rate, and the Sn debris on the optical element may be removed.

As shown in FIG. 3, the total etching rate Val rises with the increase in the temperature while the temperature of the surface of the optical element is in a range of 0° C. to approximately 60° C. When the temperature of the surface of the optical element exceeds approximately 100° C., the total etching rate Val starts to fall. Accordingly, in the first embodiment, the temperature of the optical element provided in the chamber 11 may be controlled to fall within a temperature range of 40° C. to 120° C. inclusive, or in a temperature range of 60° C. to 100° C. inclusive. As a result, the stannane gas may be prevented from being decomposed, whereby Sn may be prevented from being deposited on the surface of the optical element.

Figure 4:
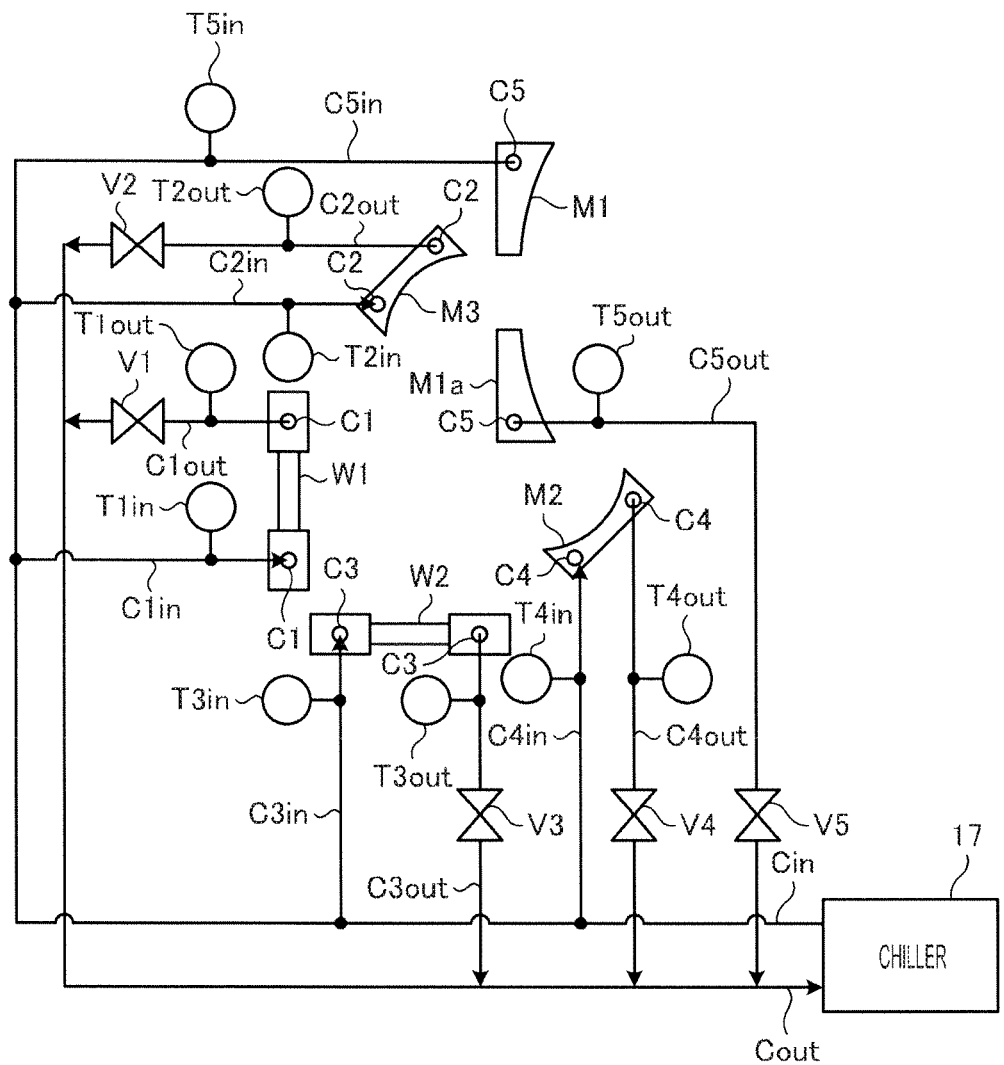
FIG. 4 schematically illustrates the configuration for controlling the temperature of optical elements provided in a chamber according to the first embodiment.

FIG. 4 schematically illustrates the configuration for controlling the temperature of the optical element provided in the chamber according to the first embodiment. In FIG. 4, the windows W1 and W2, the EUV collector mirror M1, and the off-axis paraboloidal mirrors M2 and M3, hereinafter, simply referred to as optical elements W1 and W2 and M1 through M3, are given as examples of the optical elements whose temperature is to be controlled. However, this disclosure is not limited to these.

As shown in FIGS. 1 and 4, the EUV light generation system 1 may include a chiller 17. The chiller 17 may be provided outside the chamber 11. The chiller 17 may feed, into a main supply pipe Cin, a heat carrier, for example, a liquid that is stable at the operating temperature such as temperature-controlled water or oil, to control the temperatures of the optical elements W1 and W2 and M1 through M3. Sub-supply pipes C1in through C5in may branch off from the main supply pipe Cin to the respective optical elements W1 and W2 and M1 through M3. With this arrangement, the temperature-controlled heat carrier fed into the main supply pipe Cin may be supplied to the optical elements W1 and W2 and M1 through M3 via the respective sub-supply pipes C1in through C5in.

The optical elements W1 and W2 and M1 through M3 may include respective heat carrier flow channels C1 through C5. The heat carrier distributed into the sub-supply pipes C1in through C5in from the main supply pipe Cin may flow into the respective heat carrier flow channels C1 through C5 so as to circulate inside the respective optical elements W1 and W2 and M1 through M3. As a result of this arrangement, the temperatures of the optical elements W1 and W2 and M1 through M3 may be controlled to fall within the target temperature range.

The heat carrier having circulated in the heat carrier flow channels C1 through C5 may then flow into sub-discharge pipes C1out through C5out. The sub-discharge pipes C1out through C5out may be connected to a main discharge pipe Cout, which is connected to the chiller 17. With this arrangement, the heat carrier having flowed into the sub-discharge pipes C1out through C5out may return to the chiller 17 via the main discharge pipe Cout. The heat carrier having returned to the chiller 17 may have the temperature thereof readjusted and again be fed into the main supply pipe Cin.

The sub-supply pipes C1in through C5in and the sub-discharge pipes C1out through C5out may respectively be provided with temperature sensors T1in through T5in and T1out through T5out to detect the temperature of the heat carrier flowing through the respective pipes. The total flow rate through the temperature sensors T1in through T5in and T1out through T5out may be controlled, for example, by the EUV light generation controller 10 or by the chiller 17 equipped with a circulation pump (not shown). Using this arrangement, the heat carrier may be supplied smoothly to the optical elements W1 and W2 and M1 through M3.

The sub-discharge pipes C1out through C5out may be provided with respective flow-rate control valves V1 through V5. For example, the EUV light generation controller 10 or the chiller 17 may be configured to control the flow-rate control valves V1 through V5 in order to control the flow rate of the heat carrier flowing in the respective optical elements W1 and W2 and M1 through M3. With this, the flow rate of the heat carrier flowing in the sub-discharge pipes C1out through C5out may be controlled, and in turn, the flow rate of the heat carrier flowing in the optical elements W1 and W2 and M1 through M3 may be controlled. With this, the temperatures of the optical elements W1 and W2 and M1 through M3 may be controlled to fall within the target temperature range.

As described so far, according to the first embodiment, the temperature of the optical element may be controlled so that the target material etched with the etching gas is not deposited on the optical element again. Accordingly, in the EUV light generation system according to the first embodiment, performance degradation of the optical element provided inside the chamber may be suppressed.

Second Embodiment

An EUV light generation system according to a second embodiment of this disclosure will now be described in detail with reference to the drawings.

Figure 5:
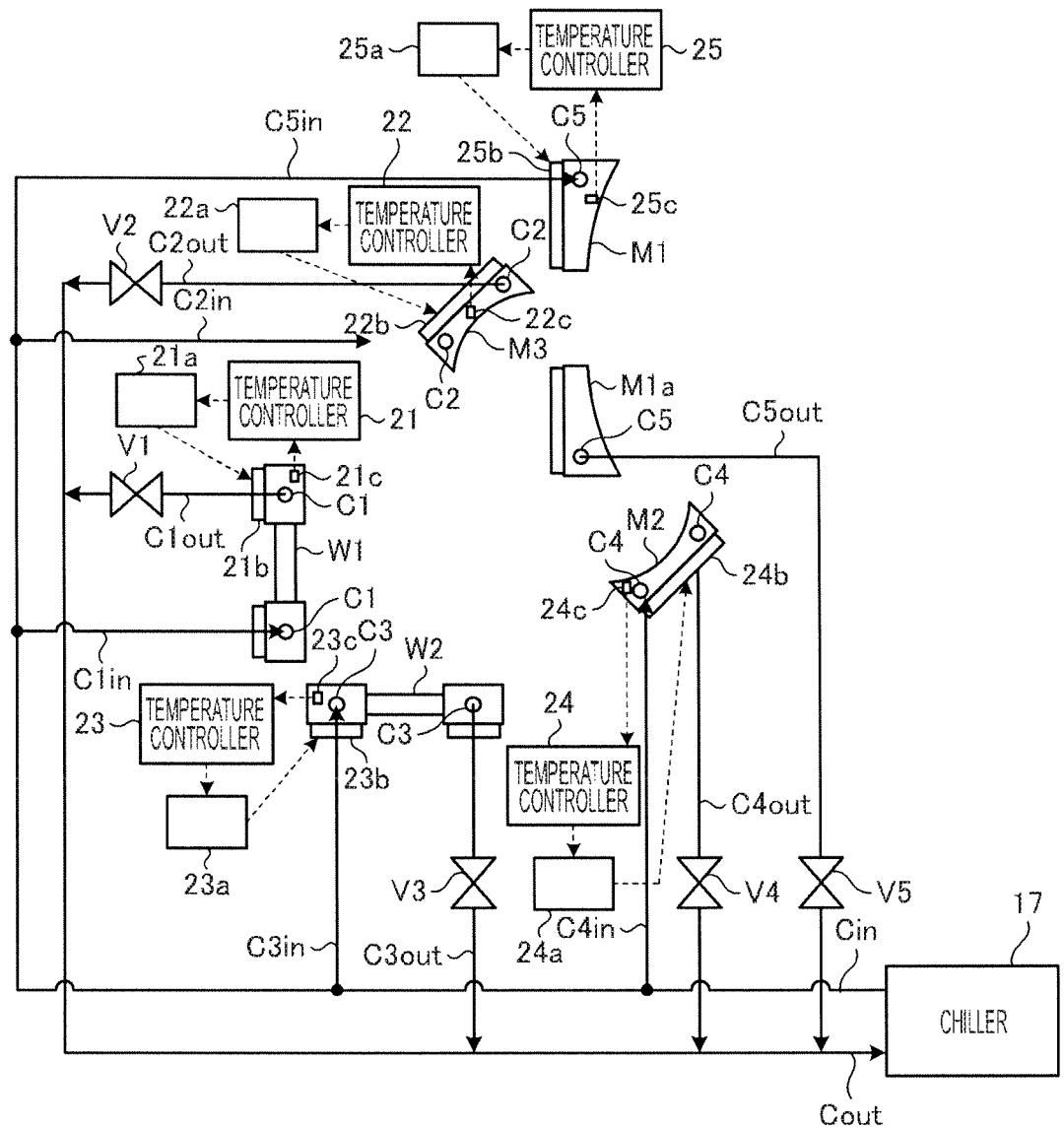
FIG. 5 schematically illustrates the configuration for controlling the temperature of optical elements provided in a chamber of an EUV light generation system according to a second embodiment of this disclosure.

FIG. 5 schematically illustrates a configuration for controlling the temperatures of the optical elements provided in the chamber of the EUV light generation system according to the second embodiment. In the second embodiment, a temperature control mechanism in which a cooling mechanism and a heating mechanism are combined may be applied to the EUV light generation system 1 of the above-described first embodiment. According to this configuration, a temperature control mechanism which includes the large-capacity chiller 17 may be used in combination with another temperature control mechanism capable of heating and cooling. In this arrangement, the temperature of the optical elements may be controlled with higher precision. Accordingly, deposition of Sn onto the optical elements may be further reduced.

As shown in FIG. 5, the EUV light generation system of the second embodiment may be similar in configuration to that shown in FIG. 4, but may differ in that the optical elements W1 and W2 and M1 through M3 may further be provided with respective heaters 21b through 25b and respective temperature sensors 21c through 25c. The heaters 21b through 25b may be connected to respective power supplies 21a through 25a. The temperature detected by the temperature sensors 21c through 25c may be inputted to respective temperature controllers 21 through 25. The temperature controllers 21 through 25 may be configured to control electric current supplied to the heaters 21b through 25b from the power supplies 21a through 25a so that the temperatures inputted from the temperature sensors 21c through 25c fall within the target temperature range. The heaters 21b through 25b may be configured to heat the respective optical elements W1 and W2 and M1 through M3 in accordance with the electric current supplied from the power supplies 21a through 25a. With this, the temperatures of the optical elements W1 and W2 and M1 through M3 may be controlled to fall within the target temperature range. In a case where the temperature of a given optical element exceeds the target temperature range, the optical element may be cooled with the heat carrier supplied from the chiller 17.

As described above, according to the second embodiment, as in the first embodiment, the temperature of the optical element may be controlled so that the target material etched with the etching gas is not redeposited on the optical element.

Third Embodiment

Figure 6:
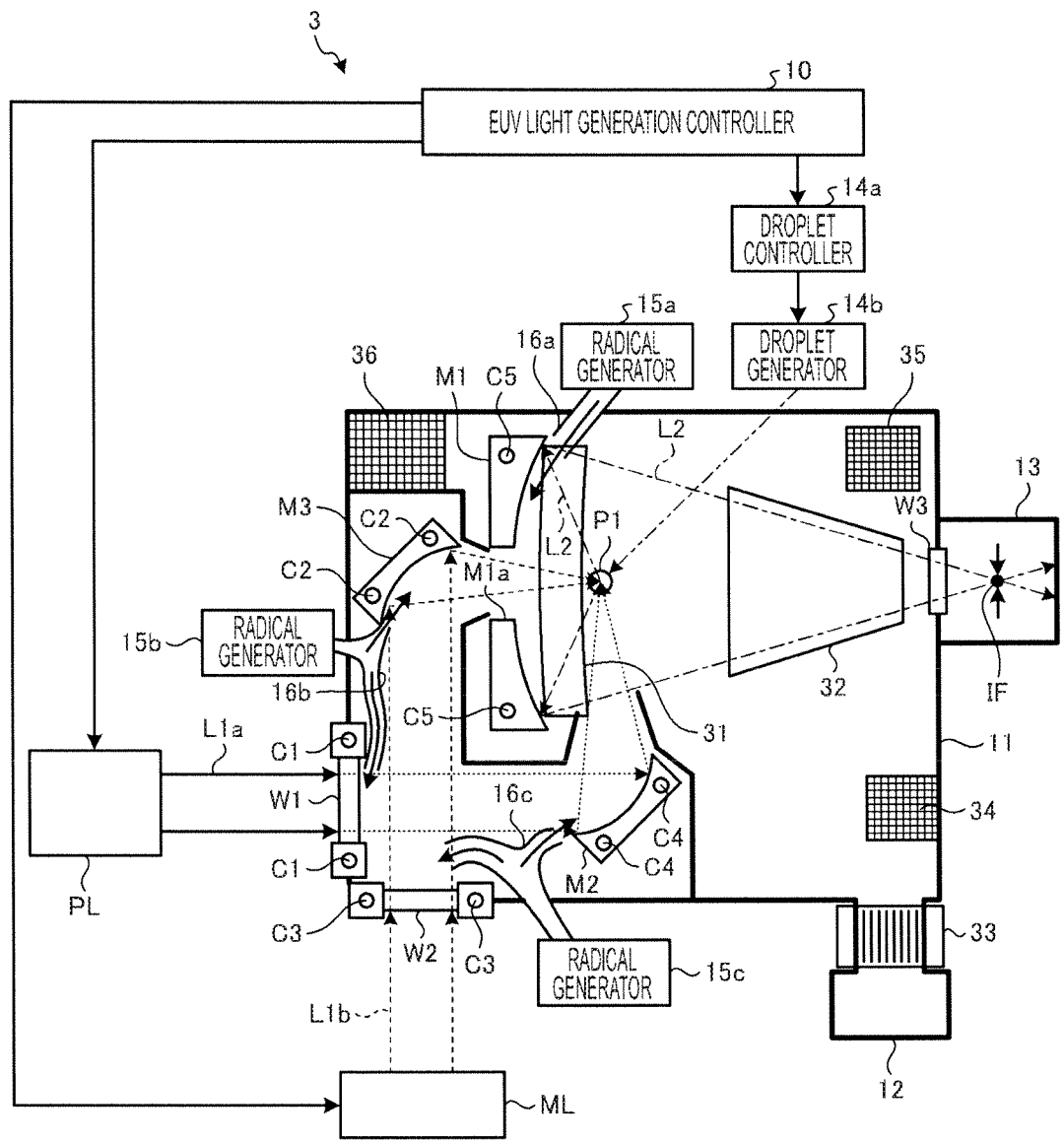
FIG. 6 schematically illustrates the configuration of an EUV light generation system according to a third embodiment of this disclosure.

An EUV light generation system according to a third embodiment of this disclosure will now be described in detail with reference to the drawings. FIG. 6 schematically illustrates a configuration of the EUV light generation system according to the third embodiment. A temperature control mechanism illustrated in FIG. 3 or FIG. 5 may be provided in the EUV light generation system of the third embodiment.

As shown in FIG. 6, an EUV light generation system 3 according to the third embodiment may be similar in configuration to the EUV light generation system 1 shown in FIG. 1, but may differ in that traps 31 through 36 may further be provided in the chamber 11 to trap Sn deposited when the stannane gas is decomposed. The trap 31 may, for example, be positioned to face the reflective surface of the EUV collector mirror M1, and may trap Sn deposited from the stannane gas produced from Sn on the surface of the EUV collector mirror M1. The trap 32 may, for example, be provided in the chamber 11 so as to face a gate valve W3, and may trap Sn deposited from the stannane gas flowing toward the exposure apparatus connection part 13 via the gate valve W3. The trap 33 may, for example, be provided at the connection between the chamber 11 and the discharge pump 12, and may trap Sn deposited from the stannane gas flowing into the discharge pump 12 from the interior of the chamber 11. The traps 34 through 36 may each be provided at a predetermined position inside the chamber 11, such as a position where Sn debris is likely to reach, and may trap Sn deposited from the stannane gas present in the chamber 11.

The temperatures of the traps 31 through 36 may be controlled to be equal to or higher than a temperature at which the stannane gas is decomposed and Sn is deposited, for example, 120° C. As a result, the concentration of the stannane gas inside the chamber 11 may be reduced, and the concentration of the stannane gas near the surface of a Sn layer deposited on the optical element may be reduced as well. Therefore, the total etching rate may be increased. Further, retaining the temperatures of the traps 31 through 36 below the melting point of Sn, 232° C., may allow Sn deposited from the stannane gas to be fixed on the surfaces of the traps 31 through 36 in a solid state. The traps 31 through 36 may be formed of a material having low reactivity with Sn, such as molybdenum (Mo), titanium (Ti) alumina ($Al_2O_3$), or the like.

Hereinafter, examples of the traps according to the third embodiment will be described in detail with reference to the drawings.

Trap 31

Figure 7:
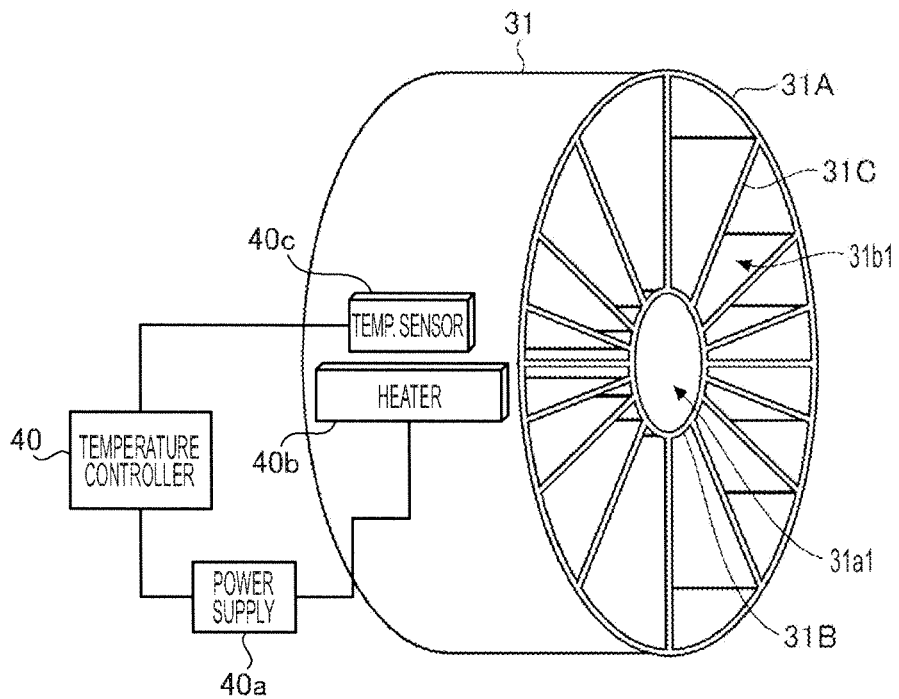
FIG. 7 schematically illustrates the configuration of a trap positioned to face the reflective surface of an EUV collector mirror in the third embodiment.

FIG. 7 is a perspective view schematically illustrating the configuration of a trap positioned to face the reflective surface of the EUV collector mirror in the third embodiment. As shown in FIG. 7, the trap 31 may generally be column-shaped with both ends thereof being open. Specifically, the trap 31 may have a double-ring structure including an outer ring 31A and a laser-beam passing ring 31E. The laser-beam passing ring 31B may be provided at the center of the outer ring 31A. The outer ring 31A and the laser-beam passing ring 31B may be arranged substantially coaxially. The inner space of the laser-beam passing ring 31B may serve as a laser-beam passing hole 31a1, through which a laser beam (e.g., the main pulse laser beam L1b) may pass. A space defined between the outer ring 31A and the laser-beam passing ring 31B may serve as EUV-light passing holes 31b1, through which the EUV light L2 may pass. Here, the EUV light L2 reflected by the EUV collector mirror M1 may travel through a space outside the outer ring 31A or inside the laser-beam passing ring 31B aside from the EUV-light passing holes 31b1.

Trapping blades 31C may radially extend between the outer surface of the laser-beam passing ring 31B and the inner surface of the outer ring 31A. Each of the trapping blades 31C may be plate-shaped. The trapping blades 31C may be configured to fix the laser-beam passing ring 31B to the outer ring 31A and define the EUV-light passing holes 31b1. Sn deposited from the stannane gas passing through the EUV-light passing holes 31b may be trapped by the trapping blades 31C.

The trap 31 configured as such may be positioned such that the axis of the laser-beam passing ring 31B substantially coincides with the beam axis of a laser beam (e.g., the main pulse laser beam L1b) focused in the plasma generation region P1 via the through-hole M1a in the EUV collector mirror M1. Further, the axis of the outer ring 31A may substantially coincide with the axis of the EUV light L2 reflected by the EUV collector mirror M1. With this, the trap 31 may allow the laser beam to pass through the laser-beam passing hole 31a1 without blocking the laser beam, and may allow the EUV light L2 reflected by the EUV collector mirror M1 to pass through the EUV-light passing holes 31b1 without reducing the energy of the EUV light L2.

The trap 31 may be heated, for example, to a temperature equal to or higher than the temperature at which the stannane gas is decomposed and Sn is deposited, for example, 120° C., as described above. The trap 31 may be provided with a heater 40b, and a power supply 40a may be connected to the heater 40b to supply electric current thereto. The trap 31 may further be provided with a temperature sensor 40c, and the temperature detected by the temperature sensor 40c may be inputted to a temperature controller 40. The temperature controller 40 may control the electric current to be supplied to the heater 40b from the power supply 40a based on the temperature detected by the temperature sensor 40c. With this, the trap 31 may be heated to a temperature equal to or higher than the aforementioned temperature, and the stannane gas passing through the trap 31 may be heated, whereby Sn may be deposited on the trap 31. That is, apart of Sn contained in the stannane gas produced from Sn on the surface of the EUV collector mirror M1 may be collected by the trap 31. As a result, the concentration of the stannane gas inside the chamber 11 may be reduced, and the concentration of the stannane gas near the surface of the Sn layer on the optical element may be reduced. Therefore, the total etching rate may be increased. Further, retaining the temperature of the trap 31 below the melting point of Sn may allow Sn to be fixed on the trap 31 in a solid state.

Trap 32

Figure 8:
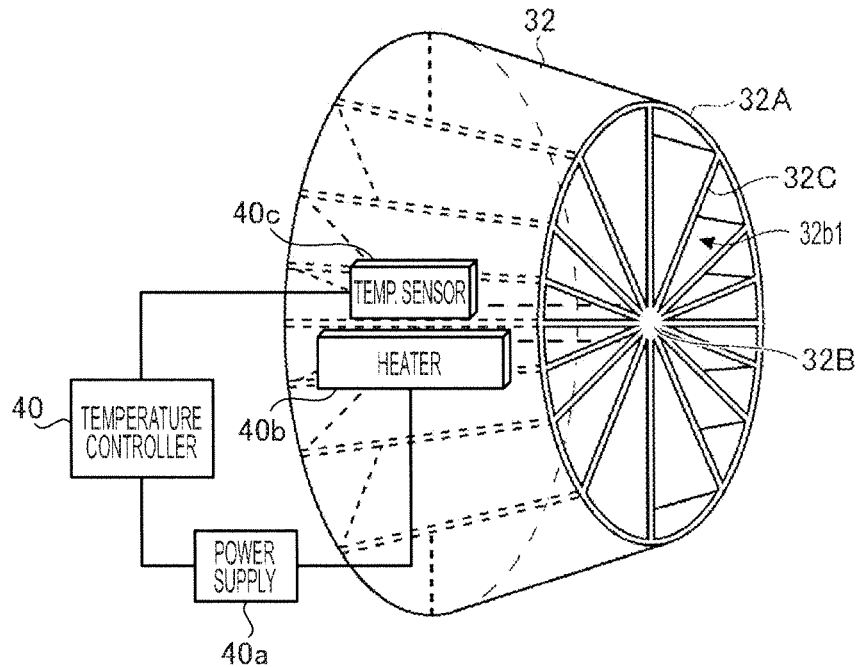
FIG. 8 is a perspective view schematically illustrating the configuration of a trap positioned to face a gate valve in the third embodiment.

FIG. 8 is a perspective view schematically illustrating the configuration of a trap positioned to face the gate valve in the third embodiment. As shown in FIG. 8, a trap 32 may be generally frustoconical in shape with both ends being open. Specifically, the trap 32 may include an outer ring 32A, a core 32B, and trapping blades 32C. The outer ring 32A may be frustoconical in shape. The core 32B may be rod-shaped and positioned at the center of the outer ring 32A. The trapping blades 32C may radially extend between the core 32B and an inner surface of the outer ring 32A. The core 32B may serve to tie the trapping blades 32C together. The core 32B may be omitted. The inner space of the outer ring 32A may serve as EUV-light passing holes 32b1, through which the EUV light L2 may pass. Here, the EUV light L2 reflected by the EUV collector mirror M1 may travel through a space outside the outer ring 32A aside from the EUV-light passing holes 32b1.

The trapping blades 32C radially extending between the core 32B and the inner surface of the outer ring 32A may define the EUV-light passing holes 32b1. The trapping blades 32C may serve to trap Sn deposited from the stannane gas passing through the EUV-light passing holes 32b1.

The trap 32 configured as such may be positioned such that the axis of the outer ring 32A substantially coincides with the axis of the EUV light L2 reflected by the EUV collector mirror M1. With this, the trap 32 may allow the EUV light L2 reflected by the EUV collector mirror M1 to pass therethrough without reducing the energy of the EUV light L2.

The trap 32 may be heated, for example, to a temperature equal to or higher than the temperature at which the stannane gas is decomposed and Sn is deposited, as described above. The configuration and the operation for heating the trap 32 may be similar to those of the trap 31 described above. Thus, detailed description thereof is omitted here. The trap 32 may be heated to a temperature equal to or higher than the aforementioned temperature, and the stannane gas passing through the trap 32 may be heated and decomposed, whereby Sn may be deposited on the trap 32. That is, Sn contained in the stannane gas flowing into the exposure apparatus connection part 13 via the gate valve W3 may be collected by the trap 32. As a result, the stannane gas may be prevented from flowing into the exposure apparatus. Further, retaining the temperature of the trap 32 below the melting point of Sn may allow Sn to be fixed on the trap 32 in a solid state.

Trap 33

Figure 9:
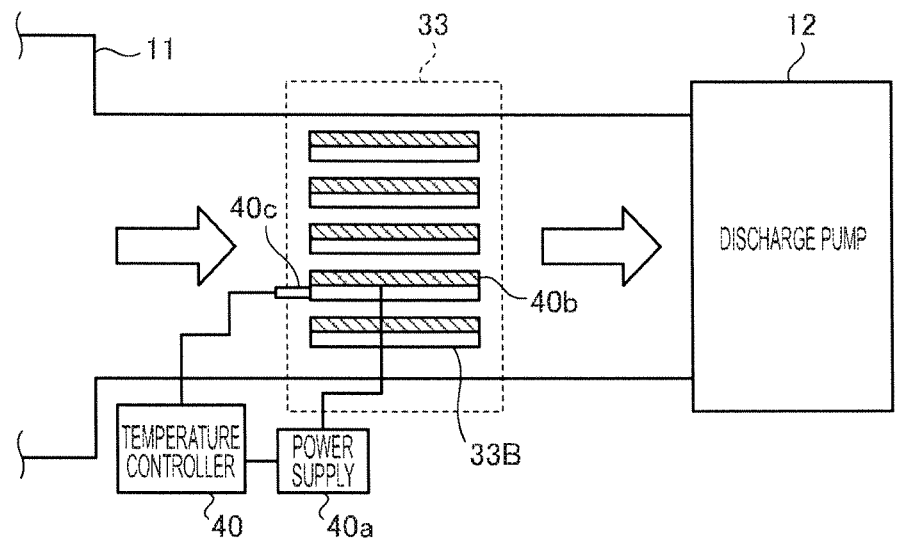
FIG. 9 schematically illustrates the configuration of a trap provided at a connection part between a chamber and a discharge pump in the third embodiment.

FIG. 9 schematically illustrates the configuration of a trap provided at a connection between the chamber and the discharge pump of the third embodiment. As shown in FIG. 9, a trap 33 may include a plurality of plate-shaped blades 33B arranged substantially parallel to the direction in which the gas flows from the chamber 11 toward the discharge pump 12. The blades 33B may be arranged such that a cross-section thereof has a lattice pattern.

The trap 33 may be heated, for example, to a temperature equal to or higher than the temperature at which the stannane gas is decomposed and Sn is deposited, as described above. The configuration and the operation for heating the trap 33 may be similar to those of the trap 31 described above. Thus, detailed description thereof is omitted here. The trap 33 may be heated to a temperature equal to or higher than the aforementioned temperature, and the stannane gas flowing into the discharge pump 12 may be heated and decomposed when passing through the trap 33, whereby Sn may be deposited on the trap 33. That is, Sn contained in the stannane gas flowing into the discharge pump 12 may be collected by the trap 33. As a result, the stannane gas may be prevented from flowing into the discharge pump 12. Further, retaining the temperature of the trap 33 below the melting point of Sn may allow Sn to be fixed on the trap 33 in a solid state.

Traps 34 through 36

Figure 10:
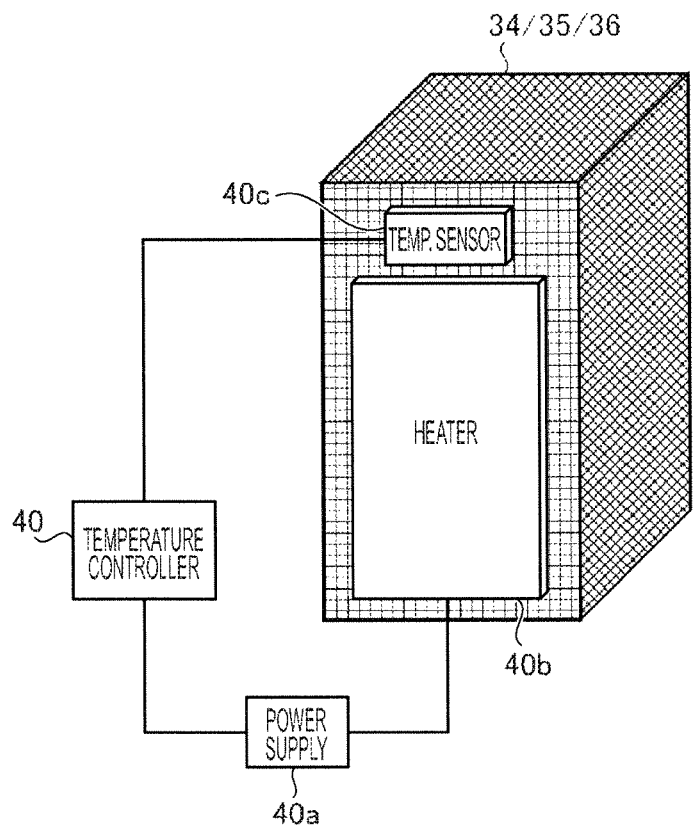
FIG. 10 schematically illustrates the configuration of a trap provided at a predetermined location inside the chamber in the third embodiment.

FIG. 10 schematically illustrates the configuration of a trap provided at a predetermined location inside the chamber of the third embodiment. As shown in FIG. 10, each of traps 34 through 36 may include wires or ribbons woven in a three-dimensional net or lattice form.

The stannane gas flowing inside the chamber 11 may pass through any of the traps 34 through 36 or the vicinities thereof. Thus, the traps 34 through 36 may be heated, for example, to a temperature equal to or higher than the temperature at which the stannane gas is decomposed and Sn is deposited, as described above. The configuration and the operation for heating each of the traps 34 through 36 may be similar to those of the trap 31 described above. Thus, detailed description thereof is omitted here. Each of the traps 34 through 36 may be heated to a temperature equal to or higher than the aforementioned temperature, and the stannane gas flowing inside the chamber 11 may be heated and decomposed when passing through any of the traps 34 through 36, whereby Sn may be deposited on any of the traps 34 through 36. With this, Sn contained in the stannane gas inside the chamber 11 may be collected by the traps 34 through 36. Further, retaining the temperature of the traps 34 through 36 below the melting point of Sn may allow Sn to be fixed on the traps 34 through 36 in a solid state. Here, each of the traps 34 through 36 may be formed of a porous material, such as sponge.

Fourth Embodiment

An EUV light generation system according to a fourth embodiment of this disclosure will now be described in detail with reference to the drawings. In the above-described third embodiment, the temperatures of the traps 31 through 36 are controlled to be equal to or higher than the temperature at which the stannane gas is decomposed and Sn is deposited, for example, 120° C., and lower than the melting point of Sn, 232° C., whereby Sn trapped in the traps 31 through 36 is fixed thereon in a solid state. On the other hand, in the fourth embodiment, Sn trapped in the traps 31 through 36 may be liquefied so as to flow out of the traps 31 through 36 by heating the traps 31 through 36 to a temperature equal to or higher than the melting point of Sn. Molten Sn that has flowed out of each of the traps 31 through 36 may be collected in a collection unit, such as a bucket.

Figure 11:
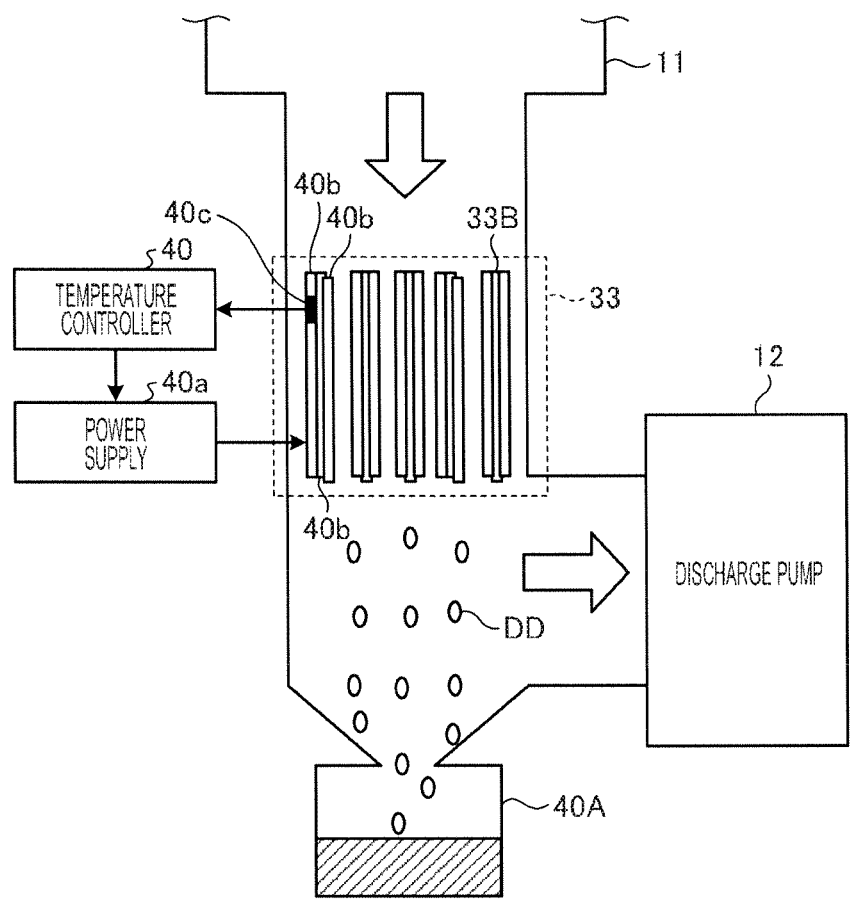
FIG. 11 schematically illustrates the configuration of a trap and a collection unit in an EUV light generation system according to a fourth embodiment of this disclosure.

FIG. 11 schematically illustrates the configuration of a trap and a collection unit in the EUV light generation system of the fourth embodiment. Note that, in FIG. 11, the trap provided at a connection between the chamber 11 and the discharge pump 12 is shown as an example.

As shown in FIG. 11, in the EUV light generation system of the fourth embodiment, a connection part between the chamber 11 and the discharge pump 12 may be bent in an L-shape. A part of the connection part on the side of the chamber 11 may extend vertically. A part of the connection part on the side of the discharge pump 12 may branch off from the connection part and extend horizontally. The trap 33 may be provided in the part of the connection part extending vertically from the chamber 11. The trap 33 may be provided with the temperature controller 40, the power supply 40a, the heater 40b, and the temperature sensor 40c, and the operation of these components may be similar to that of the third embodiment. With this configuration, the trap 33 may be heated to a temperature equal to or higher than the melting point of Sn, and molten Sn DD may flow out of the trap 33.

A collection unit 40A may be provided at the bottom of the connection part extending vertically from the chamber 11 to collect molten Sn DD flowing out of the trap 33. With this, molten Sn DD flowing out of the trap 33 may be prevented from contaminating the optical elements inside the chamber 11. By forming a connecting portion between the connection part extending from the chamber 11 and the collection unit 40A in a frustoconical shape, molten Sn DD flowing out of the trap 33 may be collected reliably into the collection unit 40A.

In the fourth embodiment, the trap 33 provided at the connection part between the chamber 11 and the discharge pump 12 is shown as an example. However, this disclosure is not limited thereto, and a similar configuration may be applied to any of the traps 31 through 36 of the third embodiment as well. That is, a heater, a power supply, a temperature sensor, a temperature controller, and a collection unit may be provided to each of the traps 31 through 36, whereby Sn trapped in each trap may be collected in a liquid state.

First Modification

Modifications of the gas introduction pipe in the above-described embodiments will now be described in detail with reference to the drawings. In the description to follow, a gas introduction pipe for making H radicals or $H_2$ gas flow along the reflective surface of the EUV collector mirror M1 will be shown as an example.

Figure 12A:
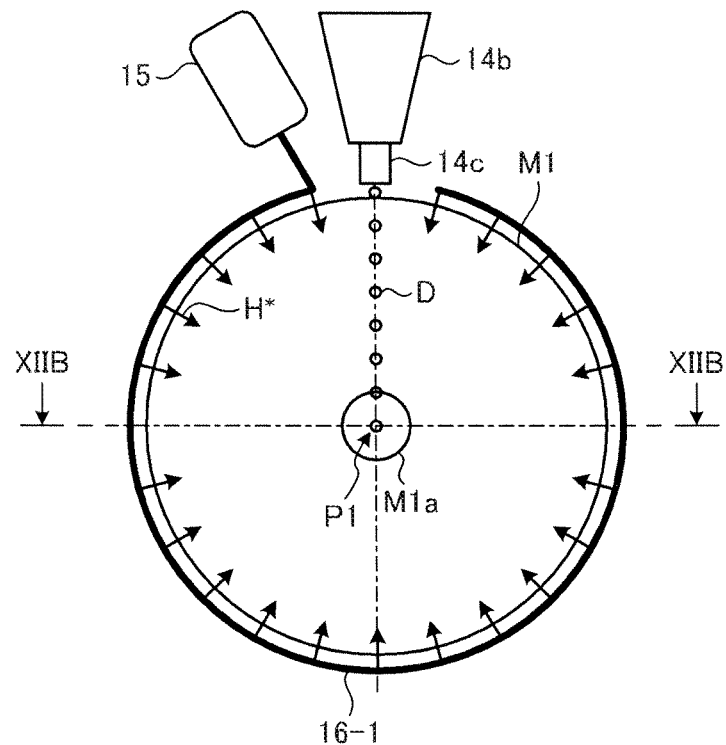
FIG. 12A schematically illustrates the configuration of a gas introduction pipe and an EUV collector mirror, as viewed from the reflective surface side of the EUV collector mirror, according to a first modification of this disclosure.
Figure 12B:
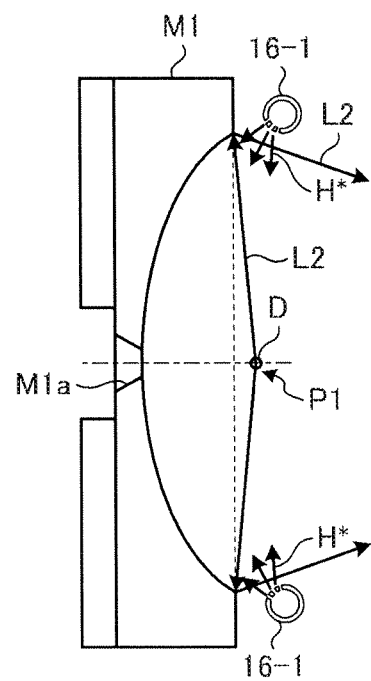
FIG. 12B is a sectional view, taken along XIIB-XIIB plane, schematically illustrating the configuration of the gas introduction pipe and the EUV collector mirror shown in FIG. 12A.

A gas introduction pipe according to a first modification will be described in detail with reference to the drawings. FIG. 12A schematically illustrates the configuration of the gas introduction pipe and the EUV collector mirror, as viewed from the reflective surface side of the EUV collector mirror, according to the first modification. FIG. 12B is a sectional view, taken along XIIB-XIIB plane, schematically illustrating the configuration of the gas introduction pipe and the EUV collector mirror shown in FIG. 12A.

As shown in FIGS. 12A and 12B, in the first modification, a gas introduction pipe 16-1 from a radical generator 15 may extend so as to surround the reflective surface of the EUV collector mirror M1. The gas introduction pipe 16-1 may have multiple holes formed therein at substantially equal intervals, as shown by the arrows. The gas introduction pipe 16-1 may be positioned such that the holes are opened toward the reflective surface of the EUV collector mirror M1. The H radicals fed into the gas introduction pipe 16-1 from the radical generator 15 may be blown out through the holes provided in the gas introduction pipe 16-1. With this, the H radicals may flow substantially uniformly along the reflective surface of the EUV collector mirror M1 from the periphery of the reflective surface of the EUV collector mirror M1. As a result, Sn deposited particularly on the reflective surface of the EUV collector mirror M1 may be etched. Here, the radical generator 15 may be replaced by a hydrogen gas supply source. In that case, the hydrogen gas may be made to flow along the reflective surface of the EUV collector mirror M1.

The gas introduction pipe 16-1 may, for example, have a gap in a part thereof, so that the droplet D outputted from the droplet generator 14b is not prevented from traveling toward the plasma generation region P1.

Second Modification

Figure 13A:
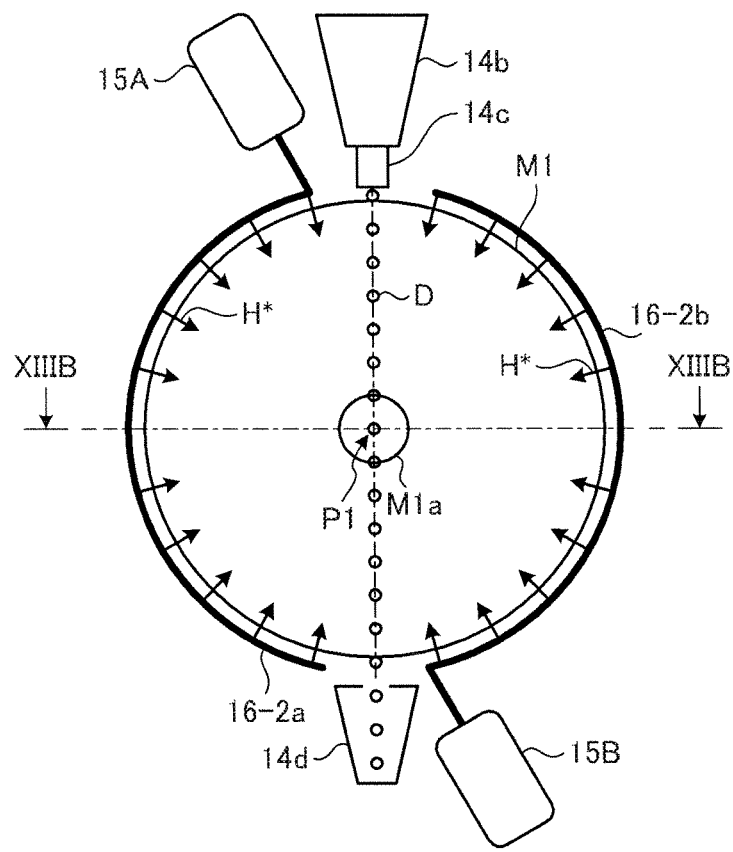
FIG. 13A schematically illustrates the configuration of gas introduction pipes and an EUV collector mirror, as viewed from the reflective surface side of the EUV collector mirror, according to a second modification of this disclosure.
Figure 13B:
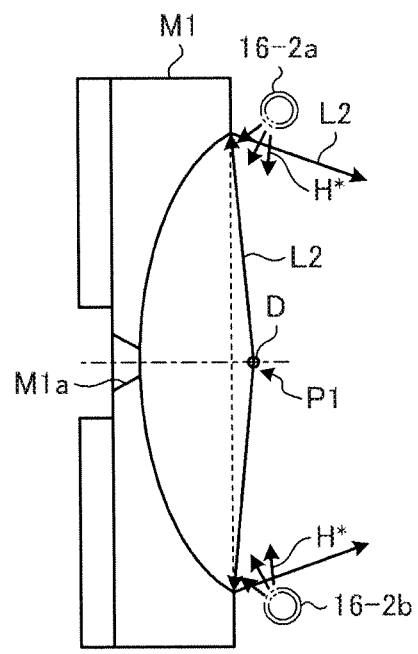
FIG. 13B is a sectional view, taken along XIIIB-XIIIB plane, schematically illustrating the configuration of the gas introduction pipes and the EUV collector mirror shown in FIG. 13A.

A gas introduction pipe according to a second modification will be described in detail with reference to the drawings. FIG. 13A schematically illustrates the configuration of the gas introduction pipes and the EUV collector mirror, as viewed from the reflective surface side of the EUV collector mirror, according to the second modification. FIG. 13B is a sectional view, taken along XIIIB-XIIIB plane, schematically illustrating the configuration of the gas introduction pipes and the EUV collector mirror shown in FIG. 13A.

As shown in FIGS. 13A and 13B, a plurality of radical generators 15A and 15B may be provided for the EUV collector mirror M1 in the second modification. In the present example, two radical generators 15A and 15B are shown, although other embodiments may use more than two. Alternatively, in place of the radical generators 15A and 15B, hydrogen gas supply sources may be used. The radical generators 15A and 15B may be positioned symmetrically about the center of the reflective surface of the EUV collector mirror M1. A semiarc-shaped gas introduction pipe 16-2a may extend from the radical generator 15A so as to surround a half of the reflective surface of the EUV collector mirror M1. Similarly, a semiarc-shaped gas introduction pipe 16-2b may extend from the radical generator 15B so as to surround the other half of the reflective surface of the EUV collector mirror M1. In this way, the reflective surface of the EUV collector mirror M1 may be surrounded by the two semiarc-shaped gas introduction pipes 16-2a and 16-2b. Each of the gas introduction pipes 16-2a and 16-2b may have multiple holes formed therein at substantially equal intervals, as is shown by the arrows. Each of the gas introduction pipes 16-2a and 16-2b may be positioned such that the holes are opened toward the reflective surface of the EUV collector mirror M1. The H radicals fed into the gas introduction pipes 16-2a and 16-2b from the respective radical generators 15A and 15B may be blown out through the holes provided in the gas introduction pipes 16-2a and 16-2b. With this, the H radicals may flow substantially uniformly along the reflective surface of the EUV collector mirror M1 from the periphery of the reflective surface of the EUV collector mirror M1. As a result, Sn deposited on the reflective surface of the EUV collector mirror M1 may be etched.

The gas introduction pipes 16-2a and 16-2b may, for example, be positioned to form gaps therebetween, so that a droplet D outputted from the droplet generator 14b is not prevented from traveling toward the plasma generation region P1, and so that the droplet D having passed through the plasma generation region P1 is not prevented from traveling toward the droplet collection unit 14d.

Third Modification

Figure 14A:
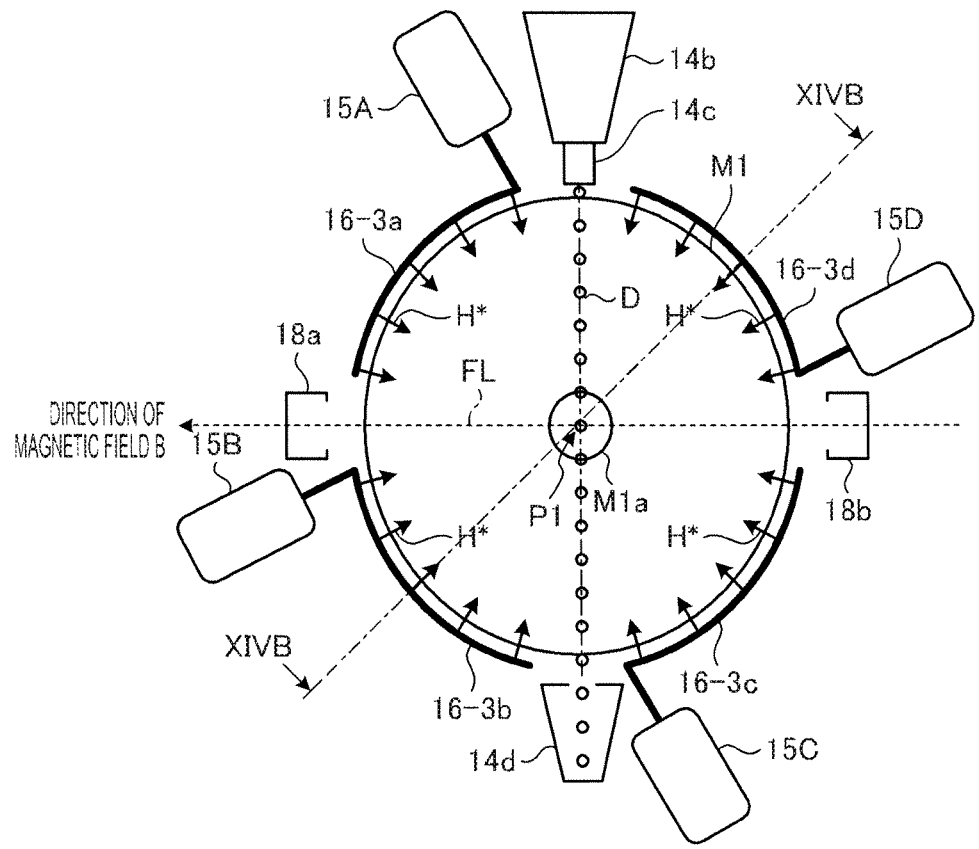
FIG. 14A schematically illustrates the configuration of gas introduction pipes and an EUV collector mirror, as viewed from the reflective surface side of the EUV collector mirror, according to a third modification of this disclosure.
Figure 14B:
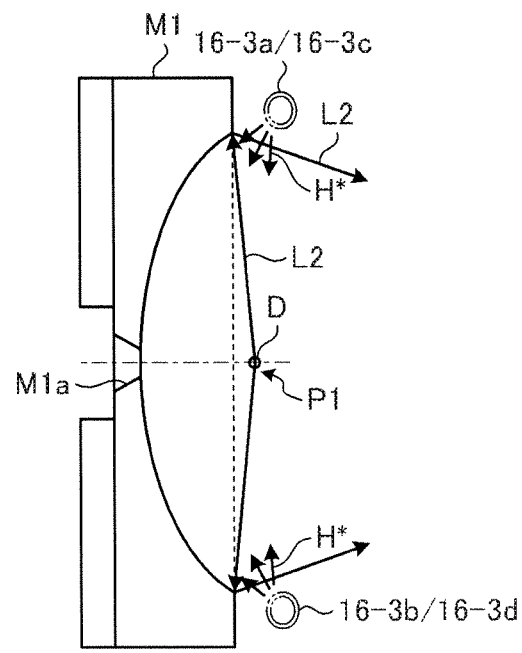
FIG. 14B is a sectional view, taken along XIVB-XIVB plane, schematically illustrating the configuration of the gas introduction pipes and the EUV collector mirror shown in FIG. 14A.

A gas introduction pipe according to a third modification will be described in detail with reference to the drawings. FIG. 14A schematically illustrates the configuration of the gas introduction pipes and the EUV collector mirror, as viewed from the reflective surface side of the EUV collector mirror, according to the third modification. FIG. 14B is a sectional view, taken along XIVB-XIVB plane, schematically illustrating the configuration of the gas introduction pipes and the EUV collector mirror shown in FIG. 14A.

As shown in FIGS. 14A and 14B, in the third modification, a plurality of radical generators 15A through 15D may be provided for the EUV collector mirror M1. In the present example, four radical generators 15A through 15D are shown, although other embodiments may use more than four. Alternatively, in place of the radical generators 15A through 15D, hydrogen gas supply sources may be used. The radical generators 15A through 15D may be positioned symmetrically at equal intervals about the center of the reflective surface of the EUV collector mirror M1. A quarter-arc-shaped gas introduction pipe 16-3a may extend from the radical generator 15A so as to surround a quarter of the reflective surface of the EUV collector mirror M1. Similarly, each of quarter-arc-shaped gas introduction pipes 16-3b through 16-3d may extend from the respective radical generators 15B through 15D so as to surround a quarter of the reflective surface of the EUV collector mirror M1, each. In this way, the reflective surface of the EUV collector mirror M1 may be surrounded by the four quarter-arc-shaped gas introduction pipes 16-3a through 16-3d. Each of the gas introduction pipes 16-3a through 16-3d may have multiple holes formed therein at substantially equal intervals, as is shown by the arrows. Each of the gas introduction pipes 16-3a through 16-3d may be positioned such that the holes are opened toward the reflective surface of the EUV collector mirror M1. The H radicals fed into the gas introduction pipes 16-3a through 16-3d from the respective radical generators 15A through 15D may be blown out through the holes formed in the gas introduction pipes 16-3a through 16-3d. With this, the H radicals may flow substantially uniformly along the reflective surface of the EUV collector mirror M1 from the periphery of the reflective surface of the EUV collector mirror M1. As a result, Sn deposited particularly on the reflective surface of the EUV collector mirror M1 may be etched.

The gas introduction pipes 16-3a and 16-3d may, for example, be positioned to form gaps therebetween so that the droplet D outputted from the droplet generator 14b is not prevented from traveling toward the plasma generation region P1, and so that the droplet D having passed through the plasma generation region P1 is not prevented from traveling toward the droplet collection unit 14d.

A magnetic field B may be generated so as to pass through the plasma generation region P1. Then, Sn debris, such as ions, generated in the plasma generation region P1 may be collected by the magnetic field and into ion collection units 18a and 18b. In this case, the gas introduction pipes 16-3a through 16-3d may be positioned to form gaps therebetween in order to allow the debris traveling in the magnetic field to pass through the gaps into the ion collection unit 18a and 18b.

Fourth Modification

Figure 15A:
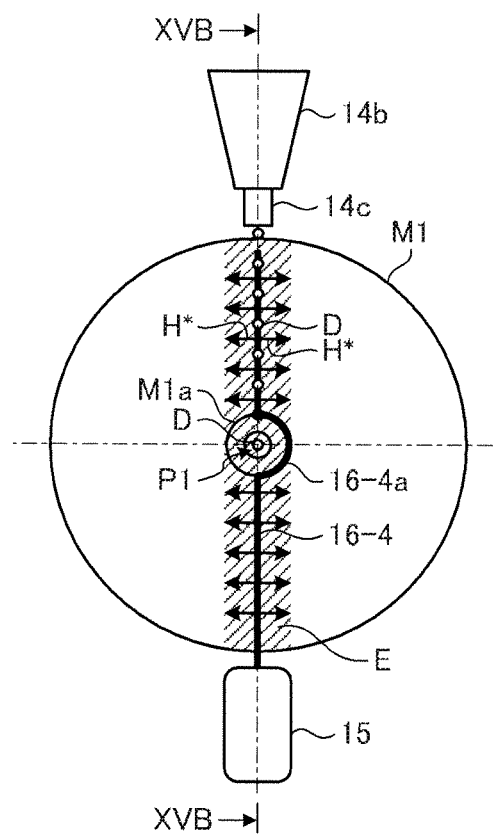
FIG. 15A schematically illustrates the configuration of a gas introduction pipe and an EUV collector mirror, as viewed from the reflective surface side of the EUV collector mirror, according to a fourth modification of this disclosure.
Figure 15B:
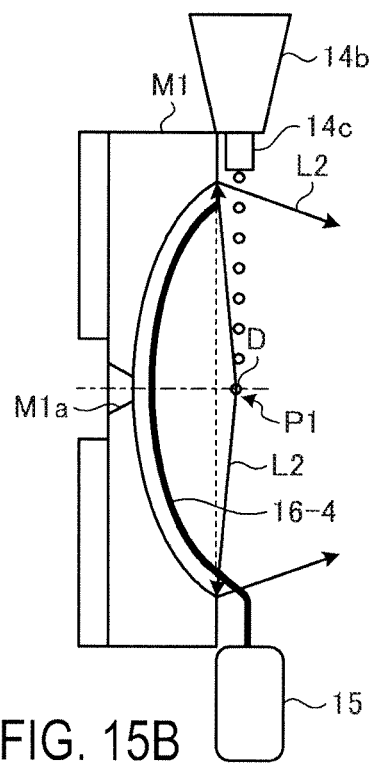
FIG. 15B is a sectional view, taken along XVB-XVB plane, schematically illustrating the configuration of the gas introduction pipe and the EUV collector mirror shown in FIG. 15A.

A gas introduction pipe according to a fourth modification will be described in detail with reference to the drawings. FIG. 15A schematically illustrates the configuration of the gas introduction pipe and the EUV collector mirror, as viewed from the reflective surface side of the EUV collector mirror, according to the fourth modification. FIG. 15B is a sectional view, taken along XVB-XVB plane, schematically illustrating the configuration of the gas introduction pipe and the EUV collector mirror shown in FIG. 15A.

As shown in FIGS. 15A and 15B, a gas introduction pipe 16-4 of the fourth modification may be curved in an arch and be positioned such that the arch follows the reflective surface of the EUV collector mirror M1 and such that the gas introduction pipe 16-4 extends linearly across the reflective surface of the EUV collector mirror M1 as viewed from the reflective surface side of the EUV collector mirror M1. A curved portion 16-4a in a semiarc shape may be formed at substantially the middle of the gas introduction pipe 16-4. The gas introduction pipe 16-4 may be positioned so that the curved portion 16-4a does not overlap the through-hole M1a in the EUV collector mirror M1.

The gas introduction pipe 16-4 having such a shape may be provided within an obscuration region E of EUV light L2. The obscuration region may refer to a region corresponding to a predetermined angular range, and a part of EUV light collected by the EUV collector mirror corresponding to the obscuration region may not be used for exposure. That is, the obscuration region is a three-dimensional region included in the angular range of the EUV light which is not used for exposure.

The gas introduction pipe 16-4 may have multiple holes formed therein on two opposite sides at substantially equal intervals, as is shown by the arrows. The gas introduction pipe 16-4 may be positioned so that the holes are opened to allow the H radicals to flow along the reflective surface of the EUV collector mirror M1.

The H radicals fed into the gas introduction pipe 16-4 from the radical generator 15 may be blown out through the holes formed in the gas introduction pipe 16-4. With this, the H radicals may flow substantially uniformly along the surface of the reflective surface of the EUV collector mirror M1 from the center line passing through the through-hole M1a across the reflective surface of the EUV collector mirror M1. As a result, Sn deposited particularly on the reflective surface of the EUV collector mirror M1 may be etched. Here, the radical generator 15 may be replaced by a hydrogen gas supply source. In that case, the hydrogen gas may be made to flow along the reflective surface of the EUV collector mirror M1.

Since the gas introduction pipe 16-4 is curved along the reflective surface of the EUV collector mirror M1, the droplet D outputted from the droplet generator 14b may not be prevented from traveling toward the plasma generation region P1.

Fifth Modification

Figure 16A:
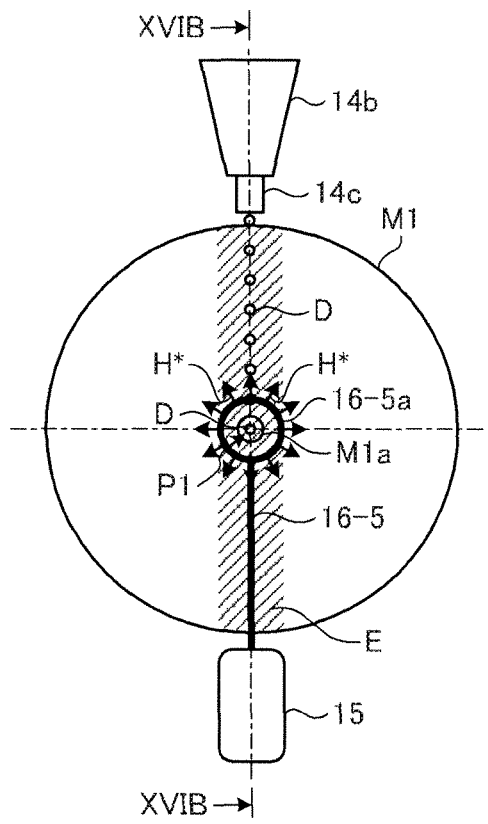
FIG. 16A schematically illustrates the configuration of a gas introduction pipe and an EUV collector mirror, as viewed from the reflective surface side of the EUV collector mirror, according to a fifth modification of this disclosure.
Figure 16B:
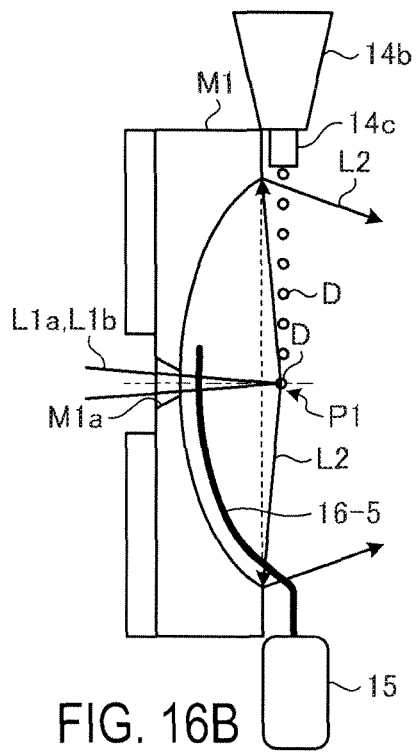
FIG. 16B is a sectional view, taken along XVIB-XVIB plane, schematically illustrating the configuration of the gas introduction pipe and the EUV collector mirror shown in FIG. 16A.

A gas introduction pipe according to a fifth modification will be described in detail with reference to the drawings. FIG. 16A schematically illustrates a configuration of the gas introduction pipe and the EUV collector mirror, as viewed from the reflective surface side of the EUV collector mirror, according to the fifth modification. FIG. 16B is a sectional view, taken along XVIB-XVIB plane, schematically illustrating the configuration of the gas introduction pipe and the EUV collector mirror shown in FIG. 16A.

As shown in FIGS. 16A and 16B, a gas introduction pipe 16-5 of the fifth modification may be curved in an arch and be positioned such that the arch follows the reflective surface of the EUV collector mirror M1 from one edge toward the through-hole M1a and such that the gas introduction pipe 16-4 extends linearly across the reflective surface of the EUV collector mirror M1 as viewed from the reflective surface side of the EUV collector mirror M1. A circular portion 16-5a may be formed at a leading end of the gas introduction pipe 16-5, and the gas introduction pipe 16-5 may be positioned such that the circular portion 16-5 surround the through-hole M1a so as not to overlap the through-hole M1a. The gas introduction pipe 16-5 of the fifth modification may be provided in the obscuration region E of the EUV light L2.

The circular portion 16-5a may have multiple holes formed therein at substantially equal intervals, as shown by the arrows. The gas introduction pipe 16-5 may be positioned such that the holes are opened toward the periphery so as to make the H radicals flow along the reflective surface of the EUV collector mirror M1. The H radicals fed into the gas introduction pipe 16-5 from the radical generator 15 may be blown out through the holes formed in the circular portion 16-5a. As a result, the H radicals may flow substantially uniformly along the reflective surface of the EUV collector mirror M1 from the vicinity of the through-hole M1a, and Sn deposited particularly on the reflective surface of the EUV collector mirror M1 may be etched. Here, the radical generator 15 may be replaced by a hydrogen gas supply source, in which case the hydrogen gas may flow along the reflective surface of the EUV collector mirror M1.

Since the gas introduction pipe 16-5 may be curved along the reflective surface of the EUV collector mirror M1, the droplet D outputted from the droplet generator 14b may not be prevented from traveling toward the plasma generation region P1.

Sixth Modification

Figure 17A:
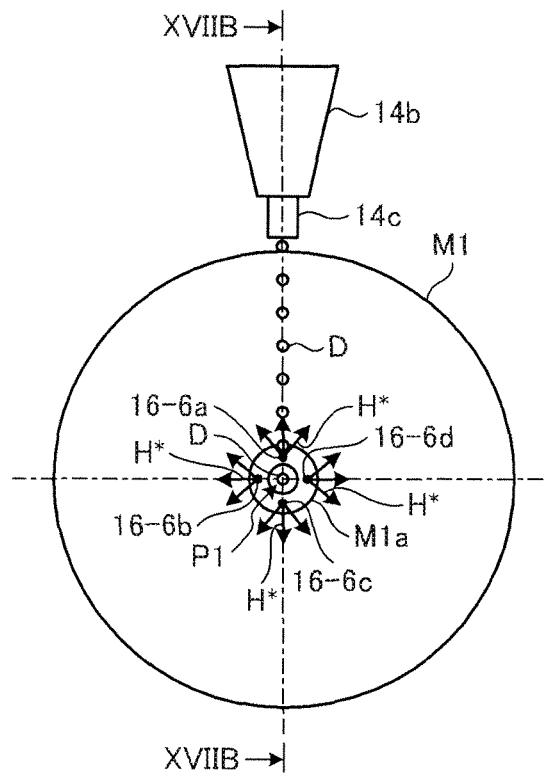
FIG. 17A schematically illustrates the configuration of gas introduction pipes and an EUV collector mirror, as viewed from the reflective surface side of the EUV collector mirror, according to a sixth modification of this disclosure.
Figure 17B:
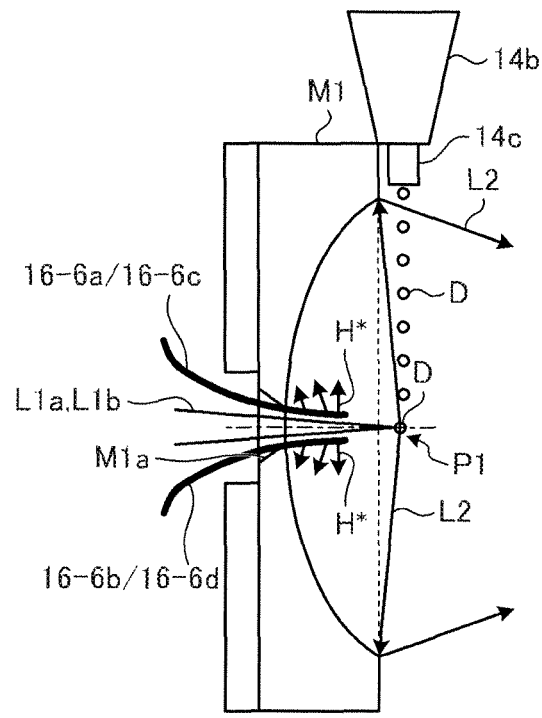
FIG. 17B is a sectional view, taken along XVIIB-XVIIB plane, schematically illustrating the configuration of the gas introduction pipes and the EUV collector mirror shown in FIG. 17A.

A gas introduction pipe according to a sixth modification will be described in detail with reference to the drawings. FIG. 17A schematically illustrates the configuration of the gas introduction pipes and the EUV collector mirror, as viewed from the reflective surface side of the EUV collector mirror, according to the sixth modification. FIG. 17B is a sectional view, taken along XVIIB-XVIIB plane, schematically illustrating the configuration of the gas introduction pipes and the EUV collector mirror shown in FIG. 17A.

As shown in FIGS. 17A and 17B, gas introduction pipes 16-6a through 16-6d of the sixth modification may each be curved at a portion thereof and be positioned so as to project from a rear surface side of an EUV collector mirror M1 toward the reflective surface side through the through-hole M1a. The gas introduction pipes 16-6a through 16-6d may be arranged symmetrically about the center of the reflective surface of the EUV collector mirror M1.

Each of leading end portions of the respective gas introduction pipes 16-6a through 16-6d projecting through the through-hole M1a may have multiple holes formed therein, as shown by the arrows. The gas introduction pipes 16-6a through 16-6d may be positioned so that the holes are opened toward the reflective surface of the EUV collector mirror M1. The H radicals fed into the gas introduction pipes 16-6a through 16-6d from the radical generator 15, such as shown in FIG. 16A, may be blown out through the holes in the respective leading end portions. With this, the H radicals may flow substantially uniformly along the reflective surface of the EUV collector mirror M1 from the vicinity of the through-hole M1a. As a result, Sn deposited particularly on the reflective surface of the EUV collector mirror M1 may be etched. Here, the radical generator 15 may be replaced by a hydrogen gas supply source, in which case the hydrogen gas may flow along the reflective surface of the EUV collector mirror M1.

Seventh Modification

Figure 18A:
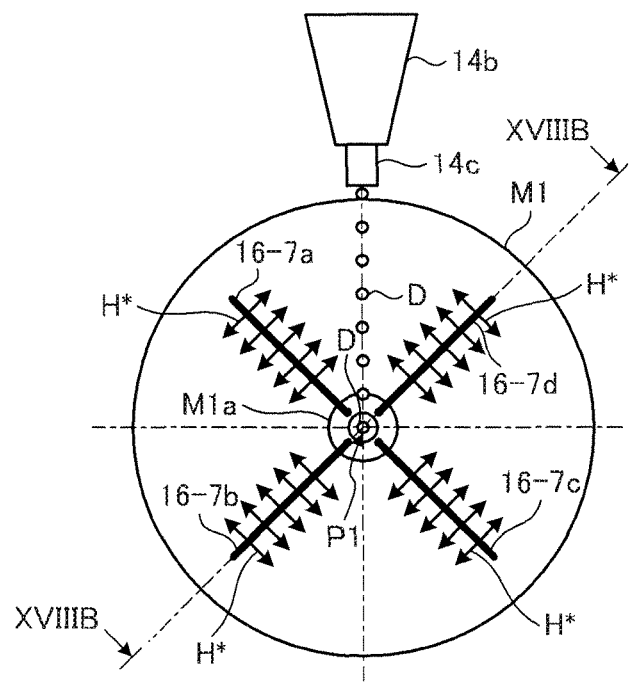
FIG. 18A schematically illustrates the configuration of gas introduction pipes and an EUV collector mirror, as viewed from the reflective surface side of the EUV collector mirror, according to a seventh modification of this disclosure.

A gas introduction pipe according to a seventh modification will be described in detail with reference to the drawings. FIG. 18A schematically illustrates the configuration of the gas introduction pipes and the EUV collector mirror, as viewed from the reflective surface side of the EUV collector mirror, according to the seventh modification. FIG. 18E is a sectional view, taken along XVIIIB-XVIIIB plane, schematically illustrating the configuration of the gas introduction pipes and the EUV collector mirror shown in FIG. 18A.

Figure 18B:
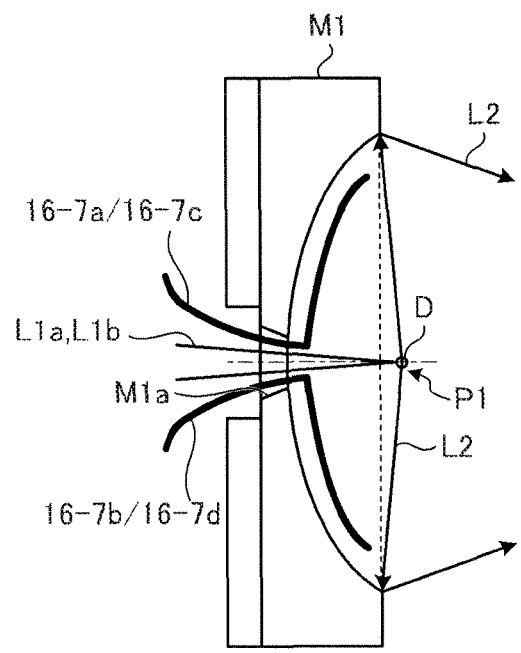
FIG. 18B is a sectional view, taken along XVIIIB-XVIIIB plane, schematically illustrating the configuration of the gas introduction pipes and the EUV collector mirror shown in FIG. 18A.

As shown in FIGS. 18A and 18B, gas introduction pipes 16-7a through 16-7d of the seventh modification may each be curved at a portion thereof and be positioned so as to project from the rear surface side of an EUV collector mirror M1 toward the reflective surface side through the through-hole M1a. Portions of the respective gas introduction pipes 16-7a through 16-7d projecting through the through-hole M1a may each extend toward the edge of the reflective surface of the EUV collector mirror M1 and be curved to follow along the reflective surface of the EUV collector mirror M1. The gas introduction pipes 16-7a through 16-7d may be arranged symmetrically about the center of the reflective surface of the EUV collector mirror M1.

The portions of the gas introduction pipes 16-7a through 16-7d projecting through the through-hole M1a may have multiple holes formed therein, as shown by the arrows. The gas introduction pipes 16-7a through 16-7d may be positioned so that the holes are opened toward the reflective surface of the EUV collector mirror M1. The H radicals fed into the gas introduction pipes 16-7a through 16-7d from the radical generator 15, such as shown in FIG. 16A, may be blown out through the holes formed therein. With this, the H radicals may flow substantially uniformly along the reflective surface of the EUV collector mirror M1. As a result, Sn deposited particularly on the reflective surface of the EUV collector mirror M1 may be etched. Here, the radical generator 15 may be replaced by a hydrogen gas supply source, in which case the hydrogen gas may flow along the reflective surface of the EUV collector mirror.

Eighth Modification

Figure 19A:
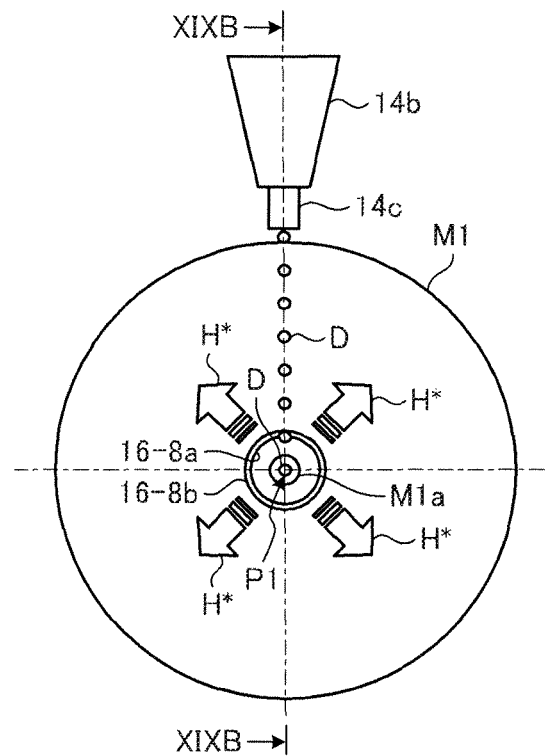
FIG. 19A schematically illustrates the configuration of a gas introduction pipe and an EUV collector mirror, as viewed from the reflective surface side of the EUV collector mirror, according to an eighth modification of this disclosure.
Figure 19B:
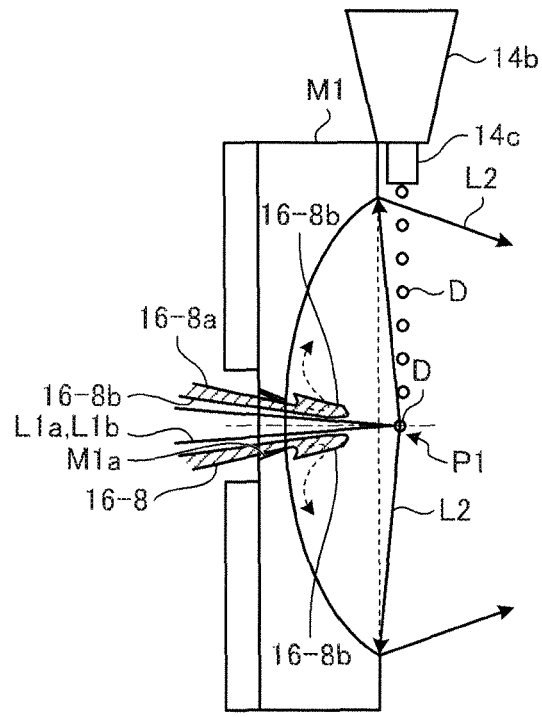
FIG. 19B is a sectional view, taken along XIXB-XIXB plane, schematically illustrating the configuration of the gas introduction pipe and the EUV collector mirror shown in FIG. 19A.
Figure 19C:
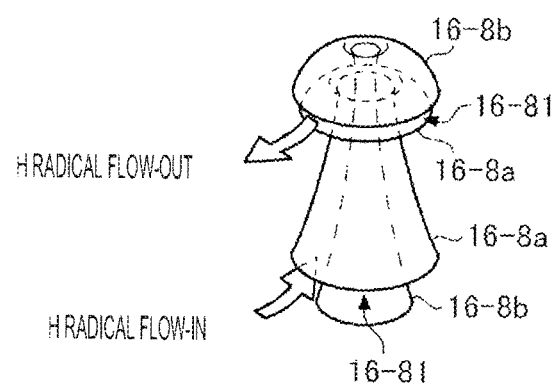
FIG. 19C is a perspective view schematically illustrating a shape of the leading end portion of the gas introduction pipe according to the eighth modification.

A gas introduction pipe according to an eighth modification will be described in detail with reference to the drawings. FIG. 19A schematically illustrates the configuration of the gas introduction pipe and the EUV collector mirror, as viewed from the reflective surface side of the EUV collector mirror, according to the eighth modification. FIG. 19B is a sectional view, taken along XIXB-XIXB plane, schematically illustrating the configuration of the gas introduction pipe and the EUV collector mirror shown in FIG. 19A. FIG. 19C is a perspective view schematically illustrating the shape of the leading end portion of the gas introduction pipe according to the eighth modification.

As shown in FIGS. 19A through 19C, a gas introduction pipe 16-8 of the eighth modification may include a generally conical outer plate 16-8a and a generally conical inner plate 16-8b. The outer plate 16-8a may be shaped such that the leading end thereof is folded back in a dome-shape. Similarly, the inner plate 16-8b may be shaped such that the leading end thereof is folded back in a dome-shape. The dome-shaped end of the inner plate 16-8b may project from the opening in the outer plate 16-8a so as to cover the dome-shaped end of the outer plate 16-8a with a gap therebetween. The gas introduction pipe 16-8 may be positioned such that the leading end of the gas introduction pipe 16-8 projects from the rear surface side of the EUV collector mirror M1 toward the reflective surface side through the through-hole M1a. A gap 16-81 may be defined between the outer plate 16-8a and the inner plate 16-8b, and may open up at one end toward the reflective surface of the EUV collector mirror M1. The H radicals may flow into the gap 16-81 from the rear surface side of the EUV collector mirror M1, and then be blown out through the opening at the end facing toward the reflective surface of the EUV collector mirror M1. With this, the H radicals may flow substantially uniformly along the reflective surface of the EUV collector mirror M1 from the vicinity of the through-hole M1a. As a result, Sn deposited particularly on the reflective surface of the EUV collector mirror M1 may be etched.

Ninth Modification

Figure 20A:
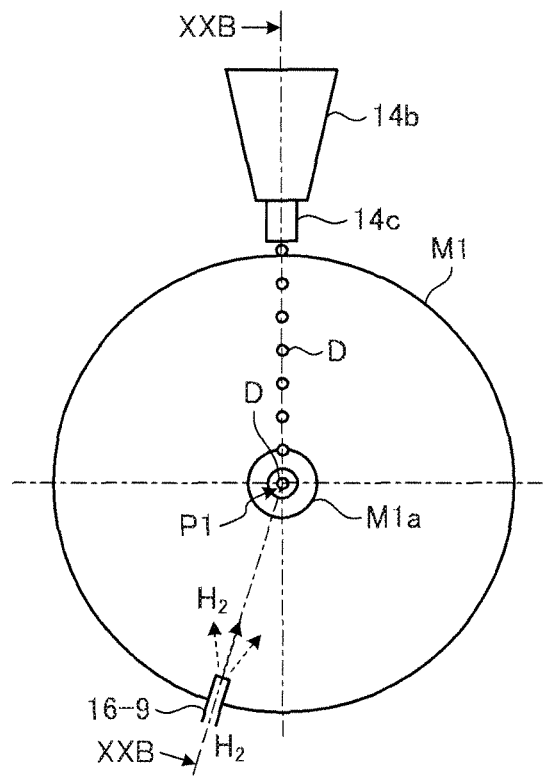
FIG. 20A schematically illustrates the configuration of a gas introduction pipe and an EUV collector mirror, as viewed from the reflective surface side of the EUV collector mirror, according to a ninth modification of this disclosure.
Figure 20B:
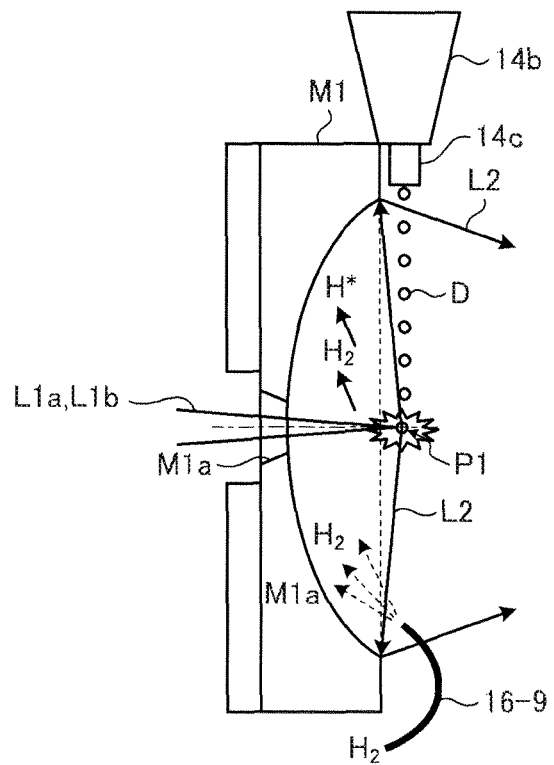
FIG. 20B is a sectional view, taken along XXB-XXB plane, schematically illustrating the configuration of the gas introduction pipe and the EUV collector mirror shown in FIG. 20A.

A gas introduction pipe according to a ninth modification will be described in detail with reference to the drawings. In the above-described embodiments and modifications, $H_2$ is turned into H radicals, and the H radicals are made to flow along the surfaces of the optical elements. In contrast, in the ninth modification, instead of the H radicals, $H_2$ gas may be blown against the optical elements in the chamber 11 (see FIG. 1 or 6), in particular against the EUV collector mirror M1 that is irradiated with EUV light L2 more intensely. FIG. 20A schematically illustrates the configuration of the gas introduction pipe and the EUV collector mirror, as viewed from the reflective surface side of the EUV collector mirror, according to the ninth modification. FIG. 20B is a sectional view, taken along XXB-XXB plane, schematically illustrating the configuration of the gas introduction pipe and the EUV collector mirror shown in FIG. 20A.

As shown in FIGS. 20A and 20B, a gas introduction pipe 16-9 of the ninth modification may be in any shape that does not substantially block the EUV light L2 reflected by the EUV collector mirror M1. The gas introduction pipe 16-9 may be positioned such that the $H_2$ gas flows along the reflective surface of the EUV collector mirror M1.

The $H_2$ gas flowing along the reflective surface of the EUV collector mirror M1 may be irradiated with short-wavelength light, such as ultraviolet light, vacuum ultraviolet light, and EUV light L2 generated in the plasma generation region P1, whereby the $H_2$ gas may be turned into H radicals. As a result, hydrogen may flow in the form of H radicals along the reflective surface of the EUV collector mirror M1, and Sn deposited particularly on the reflective surface of the EUV collector mirror M1 may be etched.

Tenth Modification

Figure 21A:
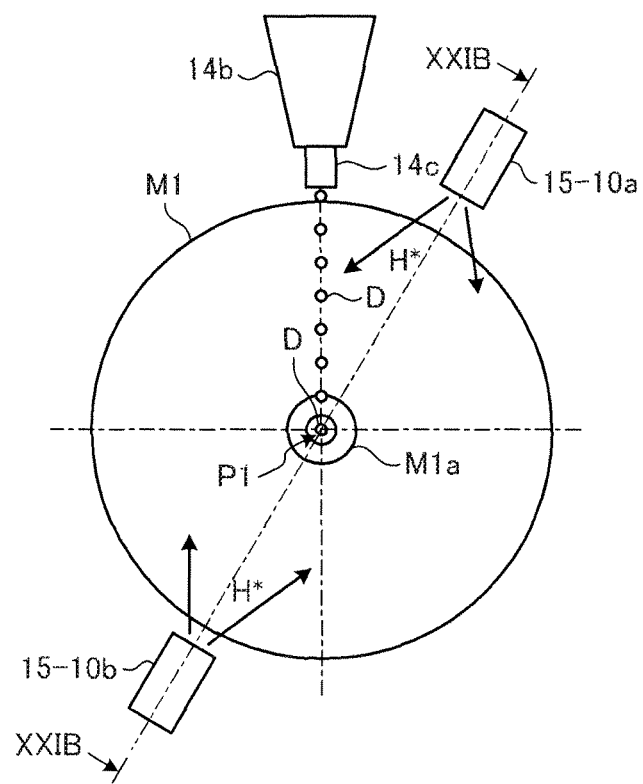
FIG. 21A schematically illustrates the configuration of radical generators and an EUV collector mirror, as viewed from the reflective surface side of the EUV collector mirror, according to a tenth modification of this disclosure.
Figure 21B:
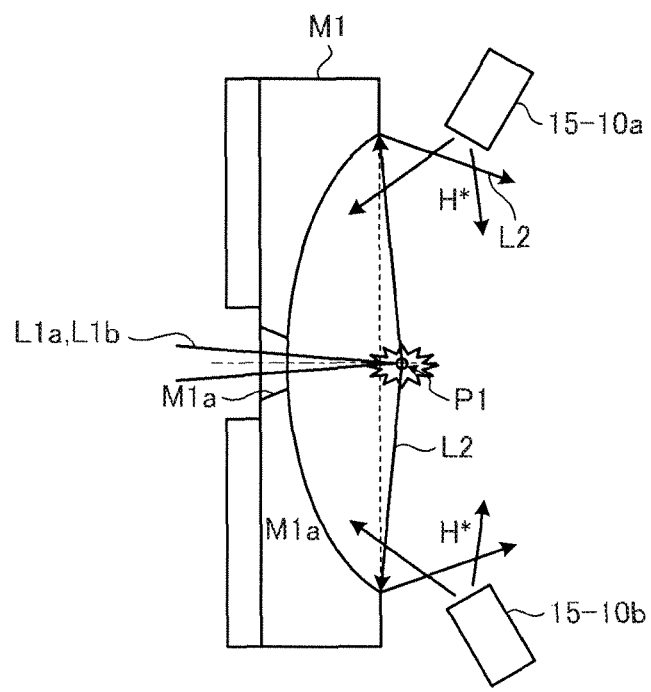
FIG. 21B is a sectional view, taken along XXIB-XXIB plane, schematically illustrating the radical generators and the EUV collector mirror shown in FIG. 21A.

A radical generator according to a tenth modification will be described in detail with reference to the drawings. In the above-described embodiments and modifications, the H radicals or the $H_2$ gas are/is made to flow along the surfaces of the optical elements via a gas introduction pipe. However, this disclosure is not limited thereto. A radical generator may be provided to directly apply the H radicals or the $H_2$ gas on the surfaces of the optical elements. FIG. 21A schematically illustrates the configuration of the radical generator and the EUV collector mirror, as viewed from the reflective surface side of the EUV collector mirror, according to the tenth modification. FIG. 21B is a sectional view, taken along XXIB-XXIB plane, schematically illustrating the radical generator and the EUV collector mirror shown in FIG. 21A.

As shown in FIGS. 21A and 21B, in the tenth modification, radical generators 15-10a and 15-10b may be provided for the EUV collector mirror M1. Alternatively, in place of the radical generators 15-10a and 15-10b, hydrogen gas supply sources may be used. The radical generators 15-10a and 15-10b may be arranged symmetrically about the center of the EUV collector mirror M1 above the reflective surface of the EUV collector mirror M1. Radical output ports of the respective radical generators 15-10a and 15-10b may be oriented such that the H radicals flow along the reflective surface of the EUV collector mirror M1. With this, the H radicals from the radical generators 15-10a and 15-10b may flow substantially uniformly along the reflective surface of the EUV collector mirror M1 from the periphery of the reflective surface of the EUV collector mirror M1. As a result, Sn deposited on the reflective surface of the EUV collector mirror M1 may be etched.

Eleventh Modification

Figure 22A:
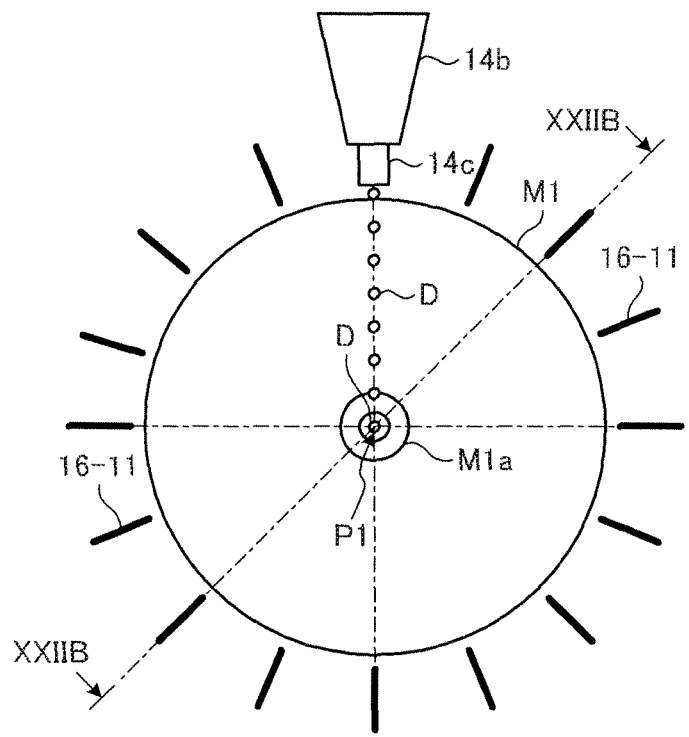
FIG. 22A schematically illustrates the configuration of filaments and an EUV collector mirror, as viewed from the reflective surface side of the EUV collector mirror, according to an eleventh modification of this disclosure.
Figure 22B:
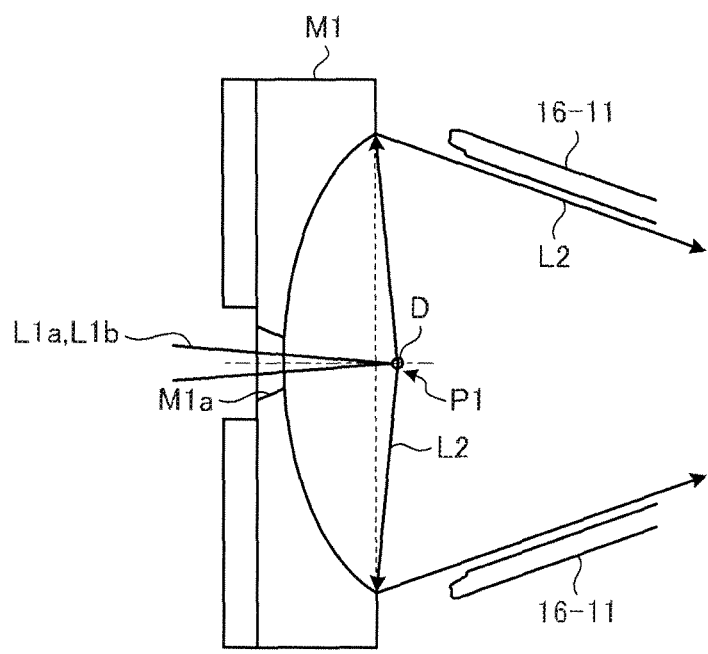
FIG. 22B is a sectional view, taken along XXIIB-XXIIB plane, schematically illustrating the configuration of the filaments and the EUV collector mirror shown in FIG. 22A.

An eleventh modification will be described in detail with reference to the drawings. In the above-described embodiments and modifications, H radicals or $H_2$ gas are/is made to flow along the surfaces of the optical elements via a gas introduction pipe. However, this disclosure is not limited thereto. Filaments may be provided in the vicinity of the optical element to turn the $H_2$ gas into the H radicals. In this configuration, the chamber 11 may be filled with the $H_2$ gas. FIG. 22A schematically illustrates the configuration of the filaments and the EUV collector mirror, as viewed from the reflective surface side of the EUV collector mirror, according to the eleventh modification. FIG. 22B is a sectional view, taken along XXIIB-XXIIB plane, schematically illustrating the configuration of the filaments and the EUV collector mirror shown in FIG. 22A.

As shown in FIGS. 22A and 22B, in the eleventh modification, a plurality of filaments 16-11 may be provided for the EUV collector mirror M1. The filaments 16-11 may be arranged symmetrically about the center of the EUV collector mirror M1 outside the reflective surface of the EUV collector mirror M1. The $H_2$ gas may be turned into the H radicals as the $H_2$ gas receives energy when passing near the filaments 16-11. Then, the H radicals may be incident on the reflective surface of the EUV collector mirror M1. As a result, Sn deposited particularly on the reflective surface of the EUV collector mirror M1 may be etched.

Fifth Embodiment

Figure 23:
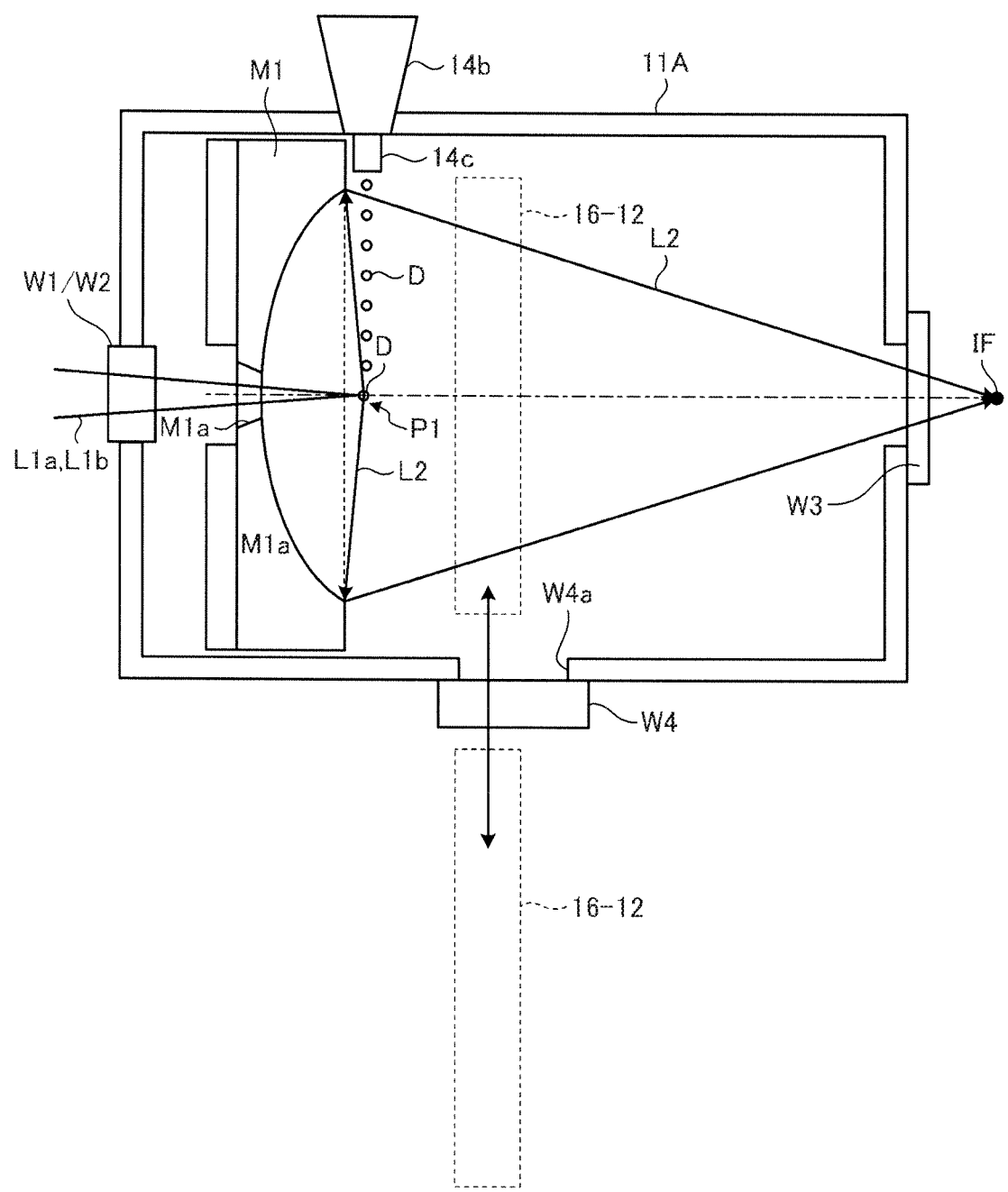
FIG. 23 is a sectional view schematically illustrating the configuration of an EUV light generation system according to a fifth embodiment of this disclosure.

An EUV light generation system according to a fifth embodiment of this disclosure will now be described in detail with reference to the drawing. In the above-described embodiments and modifications, Sn deposited on the optical element may be etched by making the H radicals or the $H_2$ gas flow along the reflective surface while the EUV light generation system is in operation. In contrast, in the fifth embodiment, Sn deposited on the optical element may be etched by making the H radicals or the $H_2$ gas flow over the entire reflective surface of the optical element while the EUV light generation system is not in operation. FIG. 23 is a sectional view schematically illustrating the configuration of the EUV light generation system according to the fifth embodiment.

As shown in FIG. 23, a chamber 11A of the fifth embodiment may have a gate W4a formed in the wall, and a radical generator 16-12 may be introduced into or retracted from a predetermined position facing the reflective surface of the EUV collector mirror M1 through the gate W4a. The gate W4a may be sealed airtightly with a shutter W4. With this configuration, while the EUV light generation system is not in operation, the shutter W4 may be moved to open the gate W4a, and the radical generator 16-12 may be introduced into the chamber 11A. Then, the H radicals or the $H_2$ gas may be blown against the entire reflective surface of the EUV collector mirror M1 from the radical generator 16-12. As a result, Sn deposited on the EUV collector mirror M1 may be etched.

Sixth Embodiment

Figure 24A:
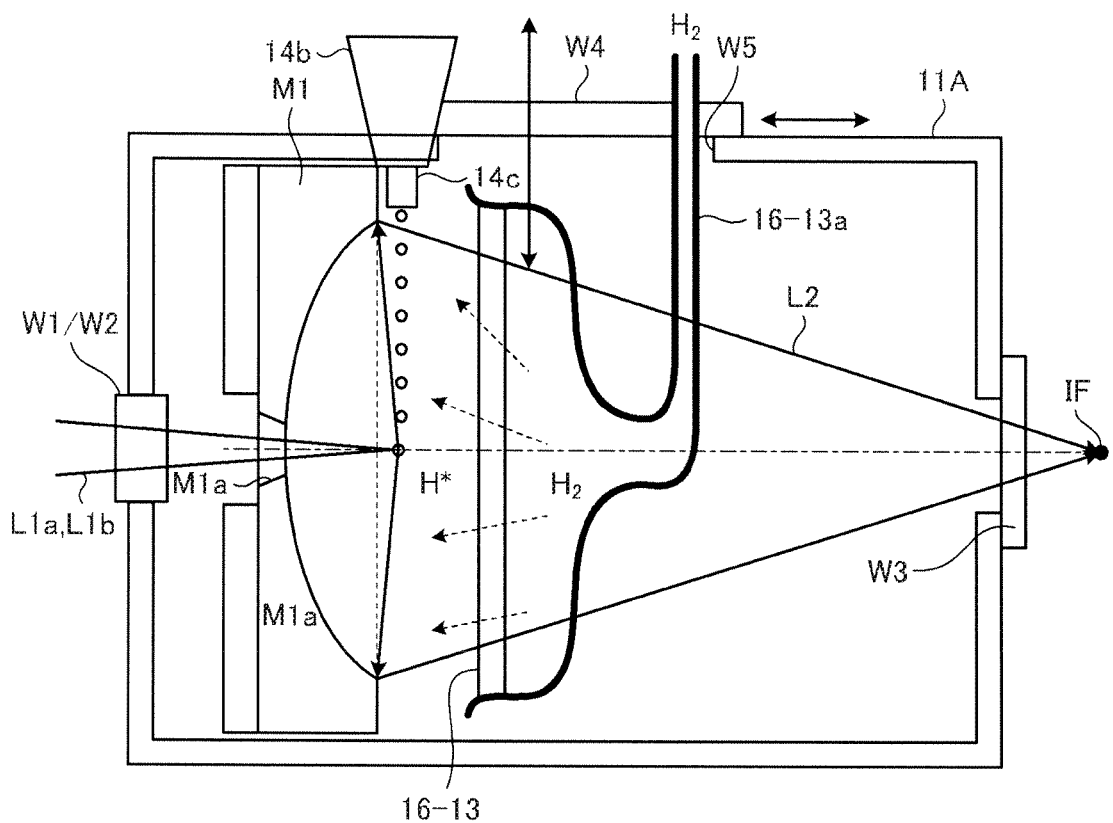
FIG. 24A is a sectional view schematically illustrating the configuration of an EUV light generation system according to a sixth embodiment of this disclosure.
Figure 24B:
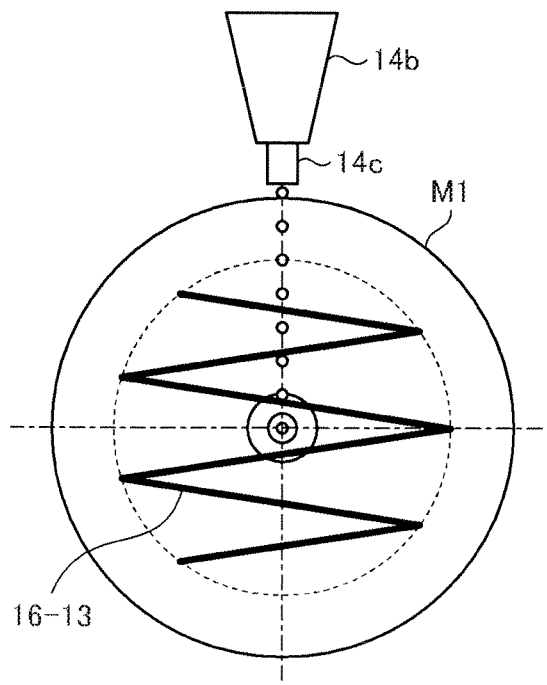
FIG. 24B schematically illustrates the configuration of a filament and an EUV collector mirror, as viewed from the reflective surface side of the EUV collector mirror shown in FIG. 24A.

An EUV light generation system according to a sixth embodiment of this disclosure will now be described in detail with reference to the drawings. In the sixth embodiment, the radical generator 16-12 of the above-described fifth embodiment may be replaced by a gas introduction pipe and a filament. The $H_2$ gas may be blown out through the gas introduction pipe, and then the $H_2$ gas may be turned into the H radicals through the filament. FIG. 24A is a sectional view schematically illustrating the configuration of the EUV light generation system according to the sixth embodiment. FIG. 24B schematically illustrates the configuration of the filament and the EUV collector mirror shown in FIG. 24A, as viewed from the reflective surface side of the EUV collector mirror.

As shown in FIGS. 24A and 24E, in the sixth embodiment, a gas introduction pipe 16-13a may be introduced into a chamber 11A. The gas introduction pipe 16-13a may be connected to an $H_2$ gas cylinder (not shown). A filament 16-13 may be provided at a gas output port of the gas introduction pipe 16-13a to turn $H_2$ gas into H radicals. While the EUV light generation system is not in operation, the shutter W4 may be moved to open a gate W5, and the gas introduction pipe 16-13a may be introduced into the chamber 11A. Then, electric current may be supplied to the filament 16-13 and the $H_2$ gas may be made to flow into the gas introduction pipe 16-13a. With this, the $H_2$ gas from the gas introduction pipe 16-13a may be turned into the H radicals, which then may be blown against the entire reflective surface of the EUV collector mirror M1. As a result, Sn deposited on the EUV collector mirror M1 may be etched.

Seventh Embodiment

Figure 25A:
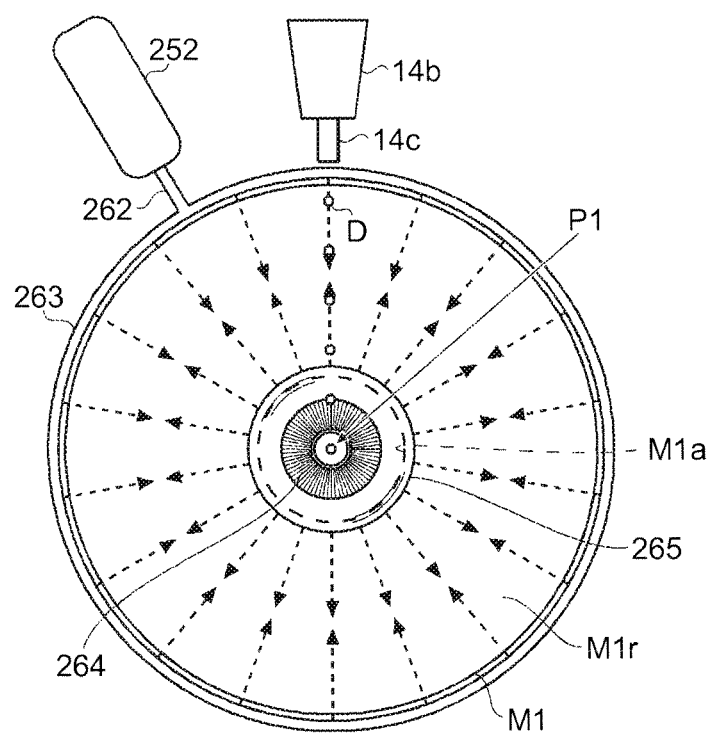
FIG. 25A schematically illustrates the configuration of an EUV collector mirror and gas introduction pipes, as viewed from the reflective surface side of the EUV collector mirror, according to a seventh embodiment of this disclosure.
Figure 25B:
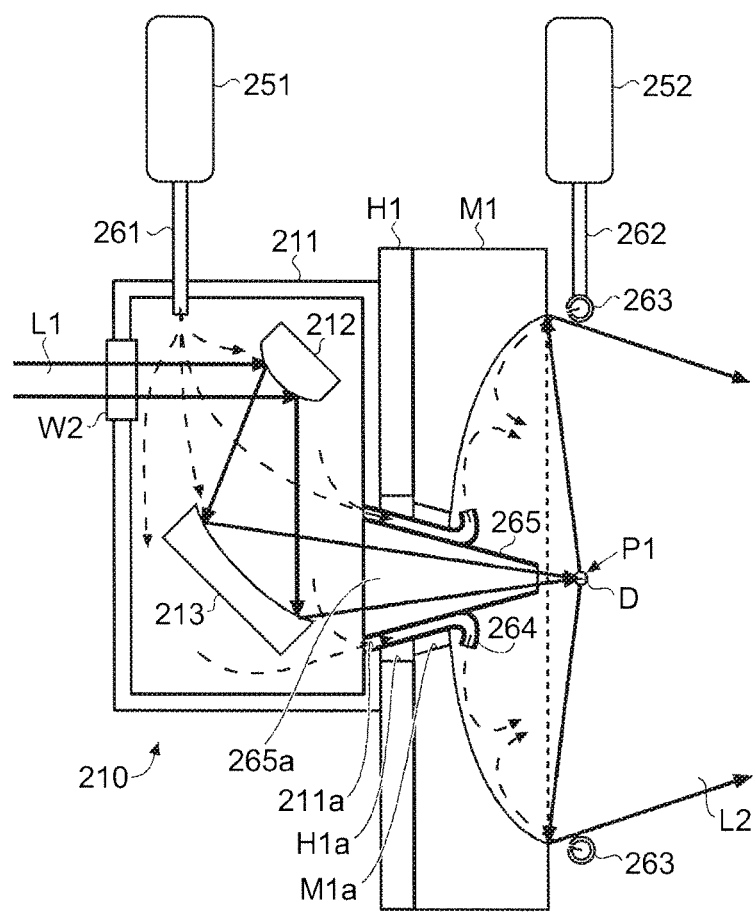
FIG. 25B is a sectional view, taken along a plane perpendicular to the reflective surface of the EUV collector mirror, schematically illustrating the configuration a laser beam focusing unit, the EUV collector mirror, and the gas introduction pipes according to the seventh embodiment.

An EUV light generation system according to a seventh embodiment of this disclosure will now be described in detail with reference to the drawings. FIG. 25A schematically illustrates the configuration of an EUV collector mirror and gas introduction pipes, as viewed from the reflective surface side of the EUV collector mirror, according to the seventh embodiment. FIG. 25B is a sectional view schematically illustrating the configuration of a laser beam focusing unit, the EUV collector mirror, and the gas introduction pipes according to the seventh embodiment, taken along a plane perpendicular to the reflective surface of the EUV collector mirror.

As shown in FIGS. 25A and 258, the gas introduction pipes of the seventh embodiment may include an outer pipe 263, an inner pipe 264, and a wall unit 265. The EUV collector mirror M1 may be fixed onto the plate H1. The plate H1 may be fixed inside the chamber 11.

The laser beam focusing optical unit 210 may include a window W2, an off-axis paraboloidal convex mirror 212, and a spheroidal concave mirror 213 arranged in this order in the direction in which the pre-pulse laser beam L1a and/or the main pulse laser beam L1b, here shown generically as L1, travel (s).

The off-axis paraboloidal convex mirror 212 and the spheroidal concave mirror 213 may be provided inside a sub-chamber 211. The sub-chamber 211 may be in communication with a hydrogen gas supply source 251 through a pipe 261. The hydrogen gas supply source 251 may be replaced by a radical generator. The pipe 261 may be positioned so that the $H_2$ gas from the pipe 261 flows along the surface of the window W2. The sub-chamber 211 may be fixed onto the plate H1. Alternatively, the sub-chamber 211 may be provided inside the chamber 11, or may be fixed to the outer wall of the chamber 11.

The sub-chamber 211, the plate H1, and the EUV collector mirror M1 may, respectively, have through-holes 211a, H1a, and M1a formed therein, through which the laser beam L1 travels toward the plasma generation region P1. The sub-chamber 211 may generally be sealed airtightly except at the connection part between the sub-chamber 211 and the pipe 261 and at the through-hole 211a. The inner pipe 264 and the wall unit 265 may be fitted into the through-hole 211a.

Figure 26A:
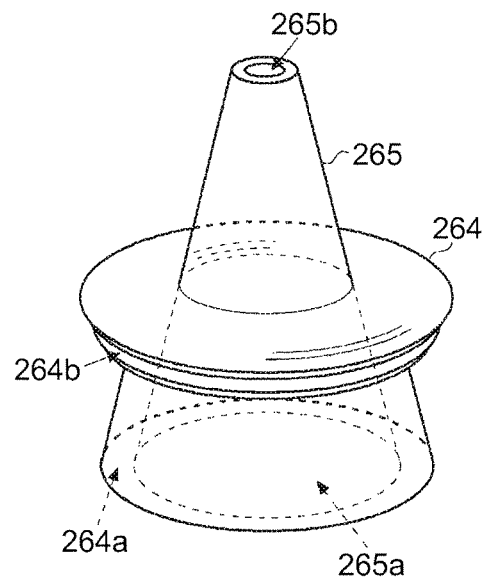
FIG. 26A is a perspective view schematically illustrating the configuration of an inner pipe and a wall unit that are integrated.
Figure 26B:
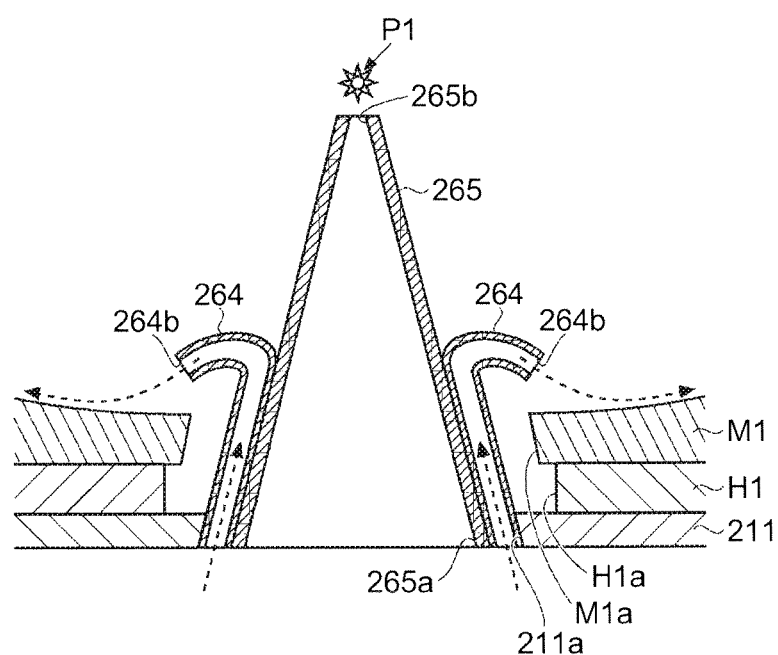
FIG. 26B is a sectional view schematically illustrating the configuration of the inner pipe and the wall unit fitted into through-holes.

FIG. 26A is a perspective view schematically illustrating the configuration of the inner pipe 264 and the wall unit 265 that are integrated. FIG. 26B is a sectional view schematically illustrating the configuration of the inner pipe 264 and the wall unit 265 fitted into the through-holes 211a, H1a, and M1a.

As shown in FIGS. 26A and 26B, the wall unit 265 may be a frustconical hollow member having openings 265a and 265b formed at the ends. The hollow part of the wall unit 265 may serve as a path through which the pre-pulse laser beam L1a and/or the main pulse laser beam L1b travel(s). The wall unit 265 may be positioned such that the axis passing through the centers of the respective openings 265a and 265b coincide with the beam axis of the pre-pulse laser beam L1a and/or the main pulse laser beam L1b reflected by the spheroidal concave mirror 213. The solid angle formed by the inner surface of the wall unit 265 may be substantially equal to the focusing solid angle of the pre-pulse laser beam L1a and/or the main pulse laser beam L1b reflected by the spheroidal concave mirror 213. With this configuration, even when a part of the pre-pulse laser beam L1a and/or the main pulse laser beam L1b strikes the inner surface of the wall unit 265, the angle of incidence of the laser beam may be relatively large; thus, the damage to the wall unit 265 may be kept small.

The inner pipe 264 may include first and second members. Each of the first and second members may include a frustconical hollow body part and a trumpet-shaped folded part. The inner diameter of the body part of the first member may be larger than the outer diameter of the body part of the second member. The first and second members may be fixed to each other with a spacer or the like (not shown) provided therebetween so as to forma substantially uniform gap. The assembled first and second members may form an opening 264a, through which the $H_2$ gas flows into the inner pipe 264, and an opening 264b, through which the $H_2$ gas flows out of the inner pipe 264.

The body part of the second member may be fixed onto the wall unit 265 at a bottom portion of the wall unit 265. The opening 264a in the inner pipe 264 may be positioned on the same plane as the opening 265a in the wall unit 265. The body part of the first member may be fixed to the periphery of the through-hole 211a in the sub-chamber 211. The inner pipe 264 may be positioned so that the $H_2$ gas that flows out through the opening 264b flows radially along the reflective surface of the EUV collector mirror M1 from the center to the periphery thereof.

Figure 27A:
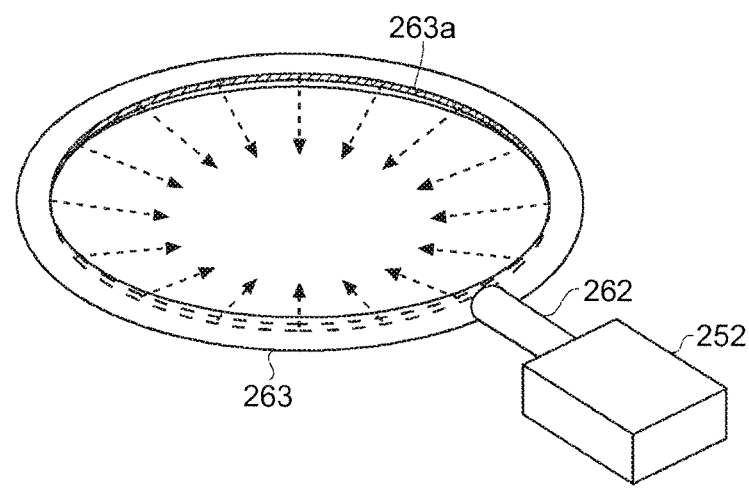
FIG. 27A is a perspective view schematically illustrating the configuration of an outer pipe, a pipe, and a hydrogen gas supply source.
Figure 27B:
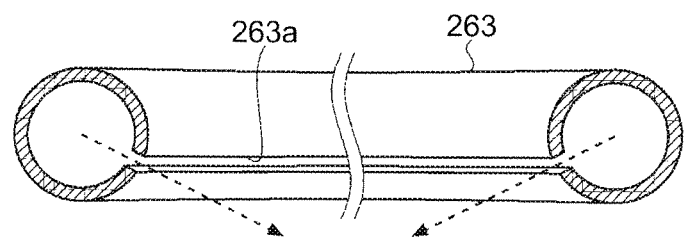
FIG. 27E is a sectional view illustrating the configuration of the outer pipe shown in FIG. 27A.

FIG. 27A is a perspective view schematically illustrating the configuration of the outer pipe 263, a pipe 262, and a hydrogen gas supply source 252. FIG. 27B is a sectional view illustrating the configuration of the outer pipe 263 shown in FIG. 27A.

As shown in FIGS. 27A and 27B, the outer pipe 263 may be annular in shape. The outer pipe 263 may be connected to the hydrogen gas supply source 252 through the pipe 262. The hydrogen gas supply source 252 may be replaced by a radical generator. A slit 263a may be formed in the inner side of the outer pipe 263 to serve as an outlet for the $H_2$ gas. The slit 263a may be formed so as to surround the inner side of the outer pipe 263. The slit 263a may, for example, be formed to face the reflective surface of the EUV collector mirror M1, as shown in FIG. 27B. The $H_2$ gas from the hydrogen gas supply source 252 may be blown out through the slit 263a in the outer pipe 263 via the pipe 262. The outer pipe 263 may be positioned such that the center of the annular outer pipe 263 substantially coincides with the center of the EUV collector mirror M1. With this, the $H_2$ gas may flow along the reflective surface of the EUV collector mirror M1 from the periphery toward the center thereof. Here, the center of the EUV collector mirror M1 may be the rotational axis of the spheroidal surface.

According to the seventh embodiment, the $H_2$ gas may flow along the reflective surface of the EUV collector mirror radially from the center toward the periphery and also from the periphery toward the center. With this, debris generated in the plasma generation region P1 may be prevented from being deposited on the reflective surface of the EUV collector mirror M1. Further, even when the debris is deposited on the reflective surface, the deposited debris may be etched.

The $H_2$ gas supplied into the sub-chamber 211 may flow along the surface of each optical element. With this, the debris may be prevented from being deposited on the optical elements. Further, even when the debris is deposited on the optical elements, the deposited debris may be etched.

The above-described embodiments and the modifications thereof are merely examples for implementing this disclosure, and this disclosure is not limited thereto. Making various modifications according to the specification or the like is within the scope of this disclosure, and other various embodiments are possible within the scope of this disclosure. For example, the modifications illustrated for particular embodiments can be applied to other embodiments as well including the other embodiments described herein.

As a device for controlling the temperature of an optical element, an example in which a temperature-controlled heat carrier is made to flow in the substrate of the optical element or an example in which the heater and the chiller are used in combination has been shown. However, this disclosure is not limited thereto, and any system capable of heating and cooling may be applied. For example, a Peltier element may be used, and the temperature of the optical element may be controlled with high precision by controlling electric current supplied to the Peltier element.

The terms used in this specification and the appended claims should be interpreted as "non-limiting." For example, the terms "include" and "be included" should be interpreted as "including the stated elements but not limited to the stated elements." The term "have" should be interpreted as "having the stated elements but not limited to the stated elements." Further, the modifier "one (a/an)" should be interpreted as "at least one" or "one or more."

What is claimed is:

1. An apparatus for generating extreme ultraviolet light, comprising:
   a chamber provided with an inlet through which a laser beam is introduced into the chamber;
   a target supply unit configured to supply a target material to a predetermined region in the chamber;
   an optical element provided in the chamber, the optical element including an EUV collector mirror configured to collect the extreme ultraviolet light emitted in the predetermined region;
   an etching gas introduction unit configured to introduce an etching gas to etch the target material in the chamber;
   a trap configured to trap the target material etched by the etching gas; and a first temperature control mechanism including a heater configured to heat the trap to a temperature higher than a temperature of the EUV collector mirror.

2. The apparatus according to claim 1, wherein:
the trap is provided to face a reflective surface of the EUV collector mirror.

3. The apparatus according to claim 1, wherein:
the chamber includes a gate valve through which the extreme ultraviolet light emitted in the predetermined region passes, and
the trap is provided to face the gate valve.

4. The apparatus according to claim 1, wherein:
the chamber includes a gate valve through which the extreme ultraviolet light emitted in the predetermined region passes, and
the trap is provided between the EUV collector mirror and the gate valve.

5. The apparatus according to claim 1, wherein:
the trap includes at least one of a wire in a net form and a wire in a lattice form.

6. The apparatus according to claim 1, further comprising:
a collection unit configured to store the target material trapped by the trap.

7. The apparatus according to claim 1, wherein
the etching gas reacts with the target material to produce a gaseous product.

8. The apparatus according to claim 7, wherein
the trap traps the target material deposited from the gaseous product.

9. The apparatus according to claim 1, further comprising:
a second temperature control mechanism configured to control a temperature of the optical element.

10. The apparatus according to claim 9, further comprising:
a supply pipe configured to supply a heat carrier to the optical element;
a heat carrier flow channel configured to allow the heat carrier to circulate in the optical element; and
a discharge pipe configured to discharge the heat carrier from the optical element, wherein
the second temperature control mechanism controls a temperature of the heat carrier to control the temperature of the optical element to which the heat carrier is supplied.

11. The apparatus according to claim 9, wherein
the second temperature control mechanism controls the temperature of the optical element to a temperature at which the target material deposited on the optical element is etched by the etching gas.

12. The apparatus according to claim 1, wherein
the first temperature control mechanism controls the temperature of the trap to a temperature at which the target material etched by the etching gas is deposited on the trap.

13. The apparatus according to claim 1, wherein
the first temperature control mechanism controls the temperature of the trap to a temperature higher than 120° C. and lower than 232° C.

14. The apparatus according to claim 13, wherein
the first temperature control mechanism includes a power supply to be connected to the heater.

15. The apparatus according to claim 1, wherein
the first temperature control mechanism includes a temperature sensor configured to detect a temperature of the trap.

16. The apparatus according to claim 1, further comprising:
a discharge pump connected to the chamber, wherein
the trap is provided at a connection between the chamber and the discharge pump.

17. The apparatus according to claim 1, wherein the trap is provided in the chamber.

18. The apparatus according to claim 1, wherein
the etching gas introduction unit includes at least one of a radical generator configured to supply hydrogen radicals and a hydrogen gas supply source configured to supply hydrogen molecules.

19. The apparatus according to claim 1, wherein
the trap is provided outside an optical path of the extreme ultraviolet light reflected by the EUV collector mirror.

20. An apparatus for generating extreme ultraviolet light, comprising:
a chamber provided with an inlet through which a laser beam is introduced into the chamber;
a target supply unit configured to supply a target material to a predetermined region in the chamber;
an optical element provided in the chamber, the optical element including an EUV collector mirror configured to collect the extreme ultraviolet light emitted in the predetermined region;
an etching gas introduction unit configured to introduce an etching gas to etch the target material in the chamber;
a trap configured to trap the target material etched by the etching gas, the trap being provided outside an optical path of the extreme ultraviolet light reflected by the EUV collector mirror; and
a first temperature control mechanism including a heater configured to heat the trap into a temperature higher than a temperature of the EUV collector mirror.

* * * * *